United States Patent
Shu et al.

(10) Patent No.: US 10,192,592 B2
(45) Date of Patent: *Jan. 29, 2019

(54) SYSTEMS AND METHODS INVOLVING DATA BUS INVERSION MEMORY CIRCUITRY, CONFIGURATION AND/OR OPERATION INCLUDING DATA SIGNALS GROUPED INTO 10 BITS AND/OR OTHER FEATURES

(71) Applicant: GSI TECHNOLOGY, INC., Sunnyvale, CA (US)

(72) Inventors: Lee-Lean Shu, Los Altos, CA (US); Paul M. Chiang, Cupertino, CA (US); Soon-Kyu Park, San Jose, CA (US); Gi-Won Cha, San Ramon, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 98 days.

This patent is subject to a terminal disclaimer.

(21) Appl. No.: 15/182,109

(22) Filed: Jun. 14, 2016

(65) Prior Publication Data

US 2016/0293231 A1    Oct. 6, 2016

Related U.S. Application Data

(63) Continuation of application No. 14/217,343, filed on Mar. 17, 2014, now Pat. No. 9,384,822.
(Continued)

(51) Int. Cl.
*G11C 7/10* (2006.01)
*G11C 11/40* (2006.01)
(Continued)

(52) U.S. Cl.
CPC .......... *G11C 7/1048* (2013.01); *G06F 1/3287* (2013.01); *G06F 13/4022* (2013.01);
(Continued)

(58) Field of Classification Search
CPC ... G11C 7/1006; G11C 7/1012; G11C 7/1072; G11C 7/1048; G11C 11/4096;
(Continued)

(56) References Cited

U.S. PATENT DOCUMENTS 5,822,268 A * 10/1998 Kirihata .................. G11C 7/10
                                                    365/230.03
6,356,485 B1    3/2002 Proebsting
(Continued)

FOREIGN PATENT DOCUMENTS

EP        0 241 129        10/1987

OTHER PUBLICATIONS

International Search Report and Written Opinion in related application No. PCT/US2014/030882 dated Nov. 7, 2014, 14 pgs.
(Continued)

*Primary Examiner* — Eric T Oberly
(74) *Attorney, Agent, or Firm* — DLA Piper LLP US

(57) ABSTRACT

Systems, methods and fabrication processes relating to dynamic random access memory (DRAM) devices involving data signals grouped into 10 bits are disclosed. According to one illustrative implementation a DRAM device may comprise a memory core, circuitry that receives a data bus inversion (DBI) bit associated with a data signal as input directly, without transmission through DBI logic associated with an input buffer, circuitry that stores the DBI bit into the memory core, reads the DBI bit from the memory core, and provides the DBI bit as output. In further implementations, DRAM devices herein may store and process the DBI bit on an internal data bus as a regular data bit.

29 Claims, 23 Drawing Sheets

Related U.S. Application Data

(60) Provisional application No. 61/801,486, filed on Mar. 15, 2013.

(51) Int. Cl.
*G06F 1/32* (2006.01)
*G06F 13/40* (2006.01)
*G06F 13/42* (2006.01)
*G11C 11/4096* (2006.01)
*H01L 21/768* (2006.01)

(52) U.S. Cl.
CPC ...... *G06F 13/4077* (2013.01); *G06F 13/4234* (2013.01); *G11C 7/1006* (2013.01); *G11C 7/1012* (2013.01); *G11C 7/1072* (2013.01); *G11C 11/4096* (2013.01); *H01L 21/76838* (2013.01); *Y02D 10/14* (2018.01); *Y02D 10/151* (2018.01)

(58) Field of Classification Search
CPC ............... G06F 1/3287; G06F 13/4022; G06F 13/4077; G06F 13/4234; H01L 21/76838; Y02D 10/14; Y02D 10/151
See application file for complete search history.

(56) References Cited

U.S. PATENT DOCUMENTS

| | | | |
|---|---|---|---|
| 2003/0080773 A1* | 5/2003 | Bobba | H01L 23/5223 326/21 |
| 2005/0216630 A1* | 9/2005 | Gaskins | G06F 13/4072 710/100 |
| 2007/0038789 A1* | 2/2007 | Macri | H03L 7/07 710/105 |
| 2007/0300095 A1* | 12/2007 | Fee | G06F 13/4217 713/400 |
| 2008/0019451 A1 | 1/2008 | Jang et al. | |
| 2008/0126714 A1* | 5/2008 | Sibigtroth | G06F 13/4221 711/150 |
| 2009/0141564 A1* | 6/2009 | Pax | G11C 7/1045 365/189.08 |
| 2009/0172449 A1* | 7/2009 | Zhang | G06F 1/26 713/324 |
| 2009/0179782 A1* | 7/2009 | Hollis | G11C 7/1006 341/55 |
| 2009/0182918 A1* | 7/2009 | Hollis | G06F 13/4234 710/106 |
| 2009/0313521 A1* | 12/2009 | Hollis | G06F 11/1008 714/752 |
| 2010/0214138 A1 | 8/2010 | Hollis | |
| 2012/0066570 A1 | 3/2012 | Brown et al. | |
| 2012/0221927 A1* | 8/2012 | Moon | H04L 1/0061 714/807 |
| 2012/0243301 A1 | 9/2012 | Maheshwari et al. | |

OTHER PUBLICATIONS

PCT International Preliminary Report on Patentability of PCT/US14/30899; dated Sep. 15, 2015; (12 pgs.).
Invitation to Pay Additional Fees and, Where Applicable, Protest Fee in related application No. PCT/US2014/030899, dated Aug. 20, 2014, 2 pgs.
File history of corresponding U.S. Appl. No. 14/217,164, filed Mar. 17, 2014.
PCT International Preliminary Report on Patentability of PCT/US14/30882; dated Sep. 15, 2015; (10 pgs.).
PCT International Search Report of PCT/US14/30899; dated Oct. 29, 2014; (4 pgs.).
PCT Written Opinion of the International Searching Authority of PCT/US14/30899; dated Oct. 29, 2014; (11 pgs.).
File history of corresponding U.S. Appl. No. 15/182,117, filed Jun. 14, 2016.

* cited by examiner

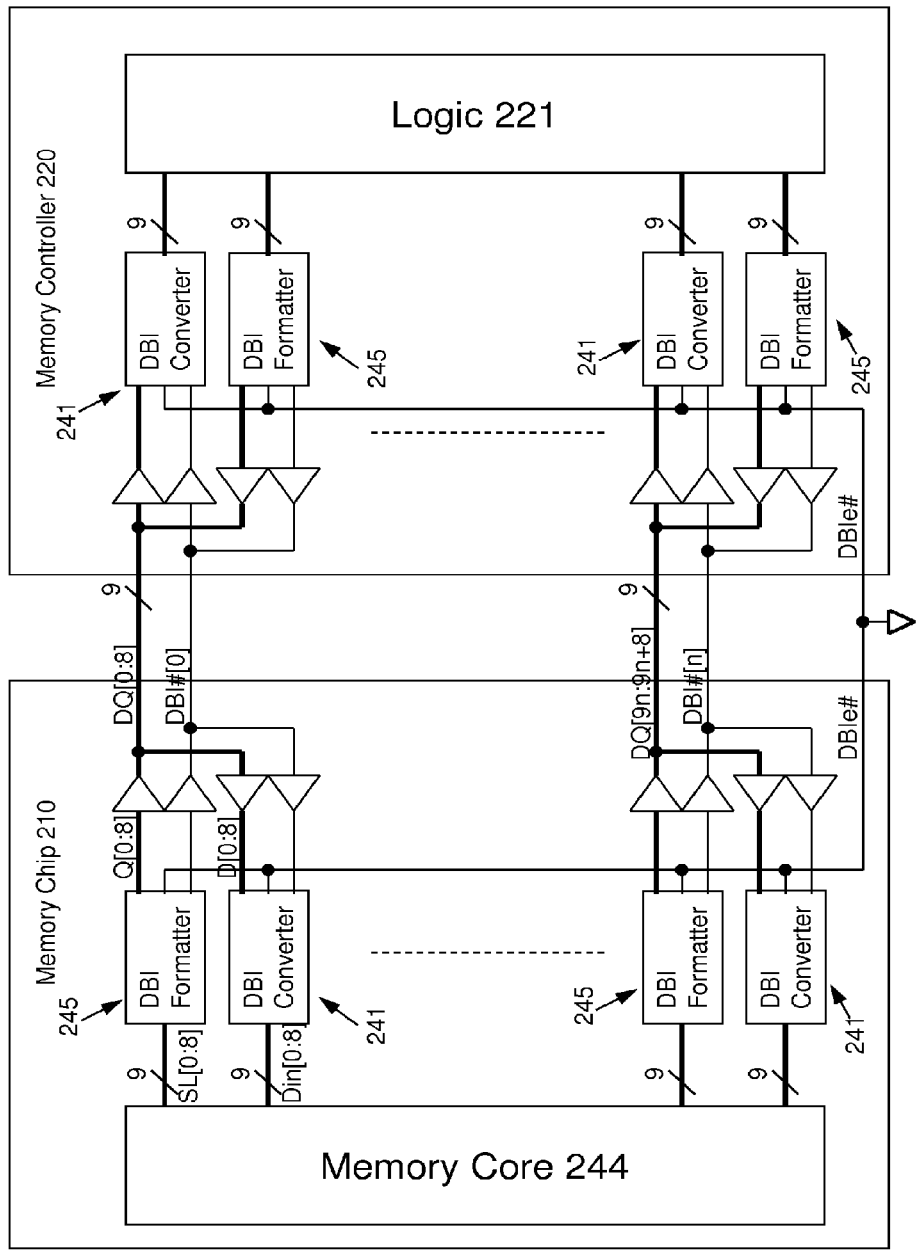
Fig. 2 Memory System with DBI
PRIOR ART

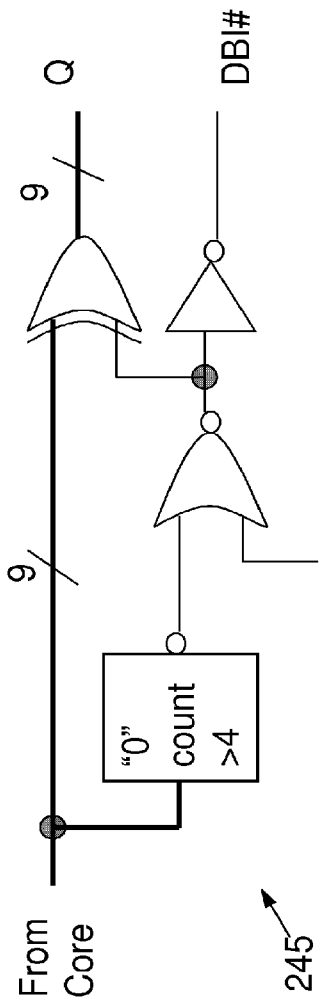
Fig. 3a DBI Formatter: Convert Bus to DBI Format
PRIOR ART
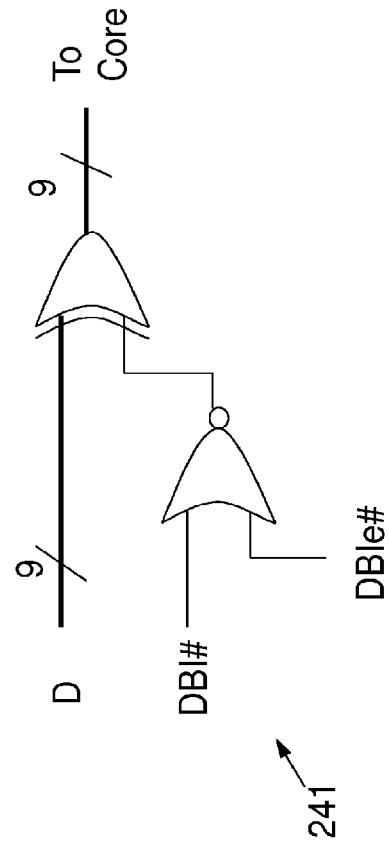
Fig. 3b DBI Converter: Convert DBI Bus to Conventional Bus
PRIOR ART

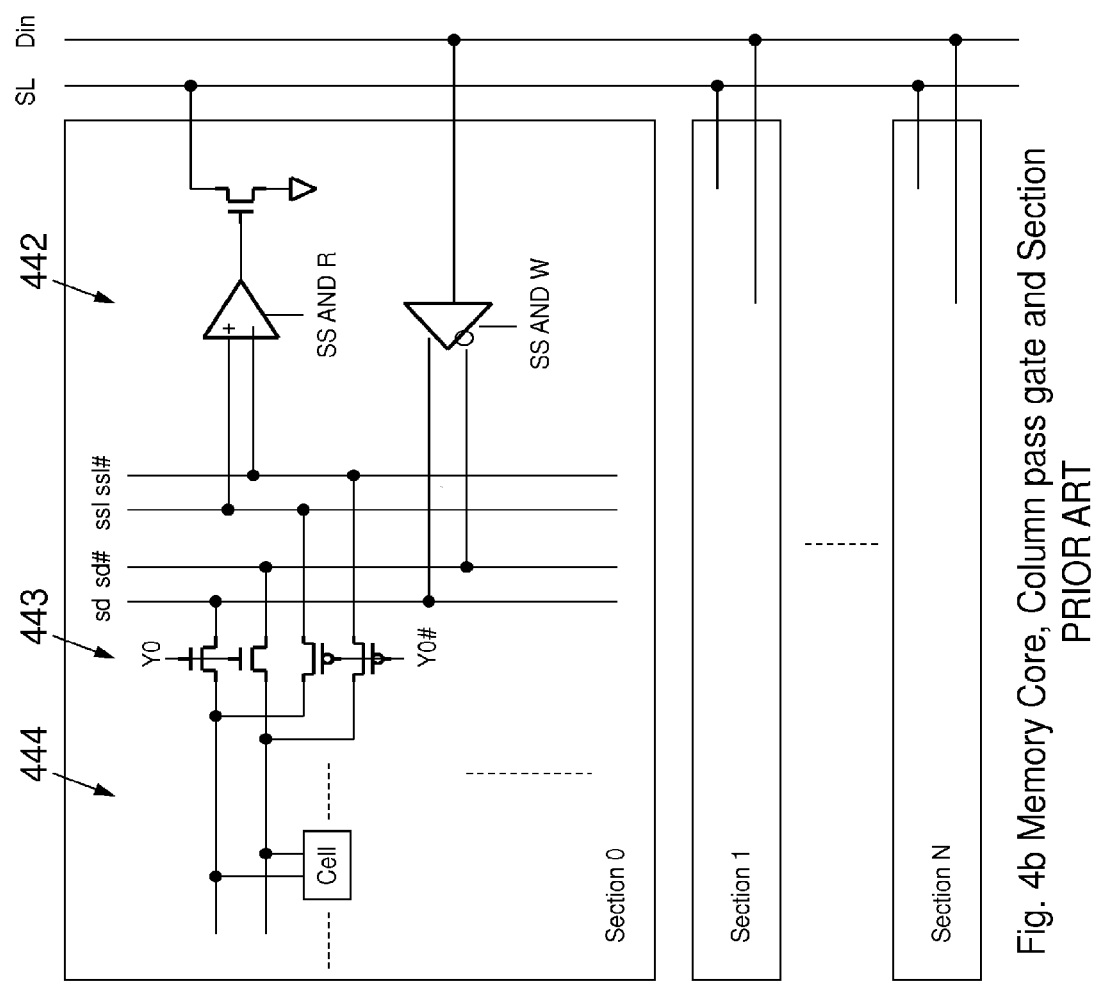
Fig. 4b Memory Core, Column pass gate and Section
PRIOR ART

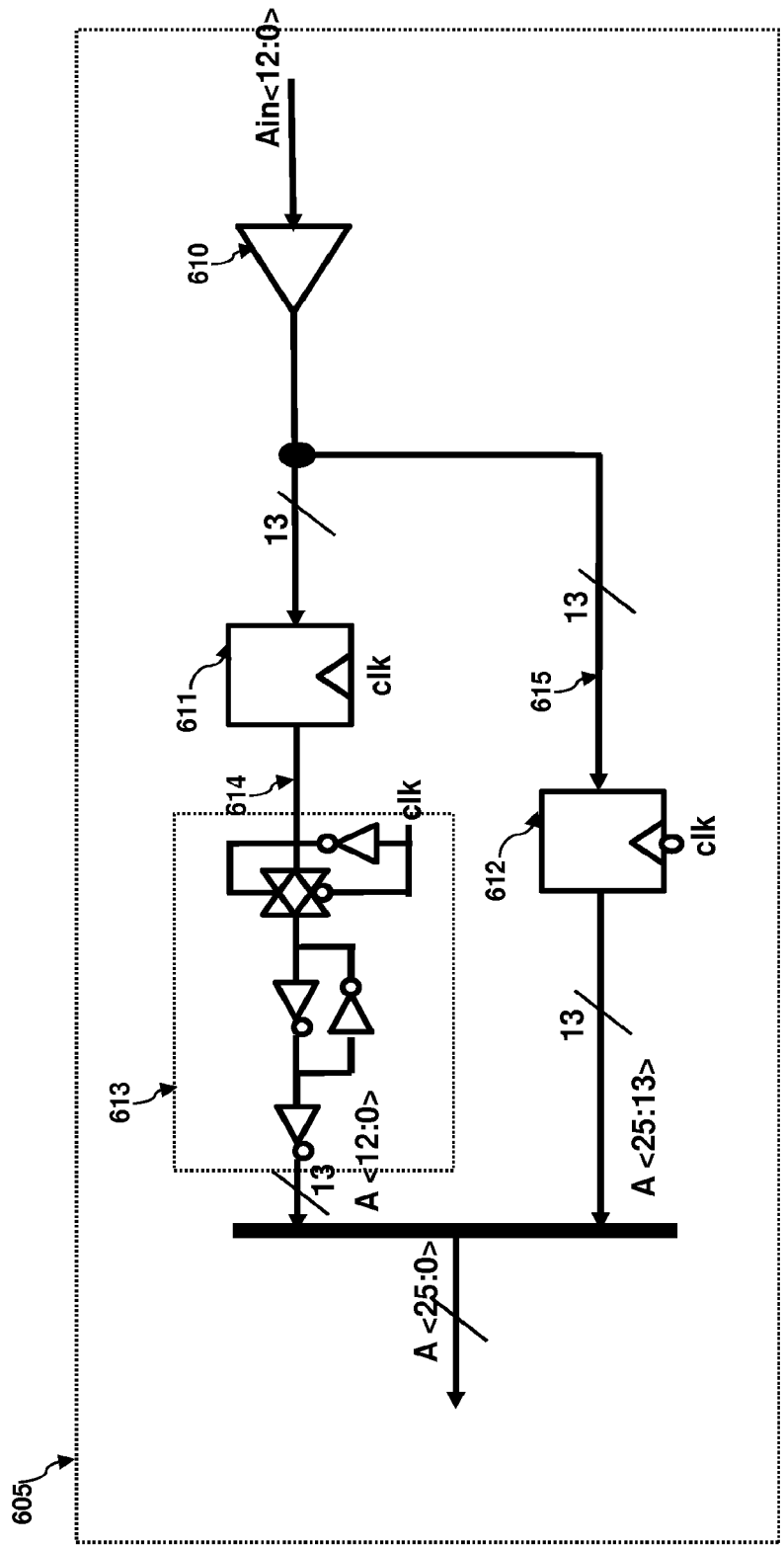
Fig. 6.b address buffer

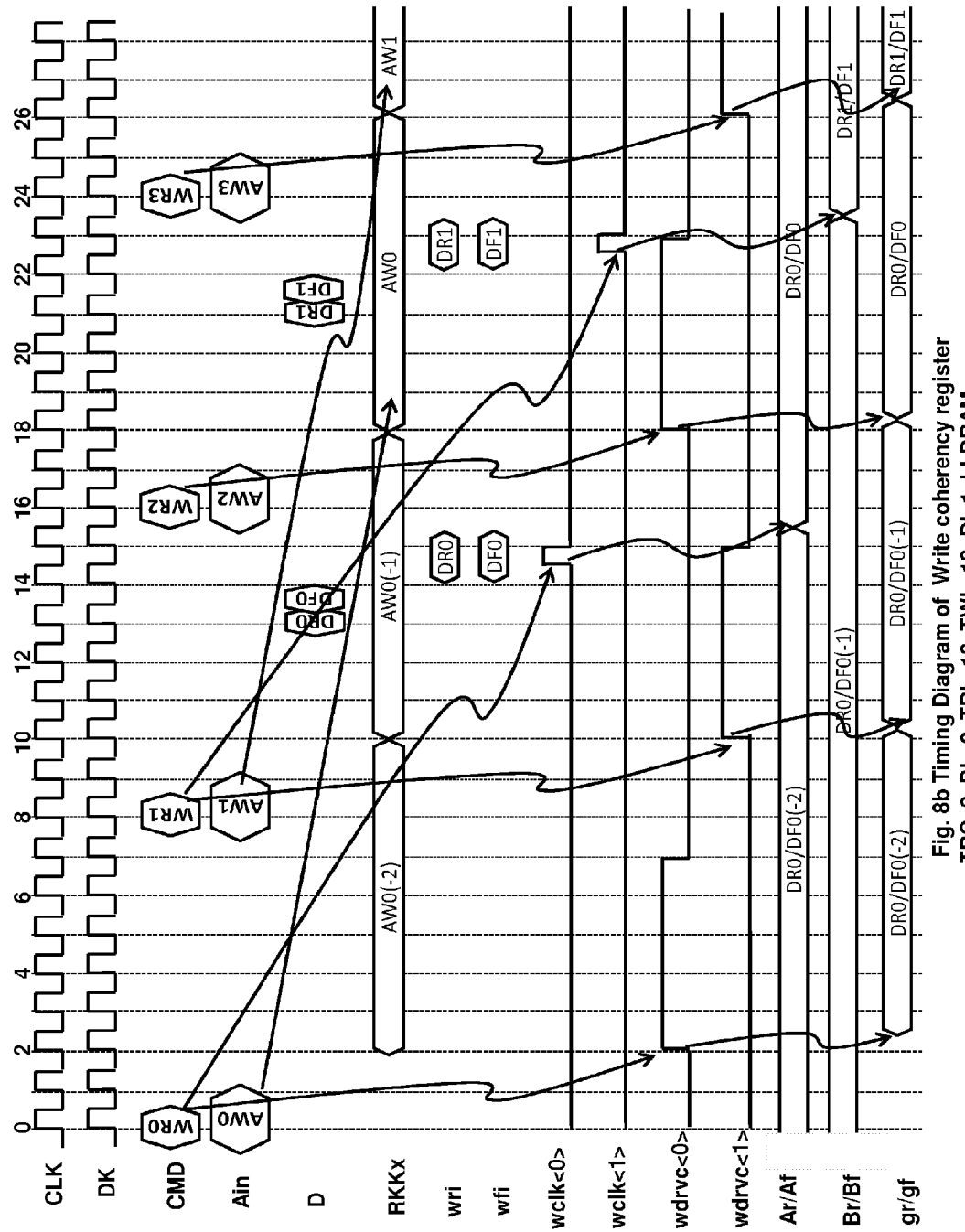
Fig. 8b Timing Diagram of Write coherency register
TRC=8, BL=2, TRL=12, TWL=13, DI=1, LLDRAM

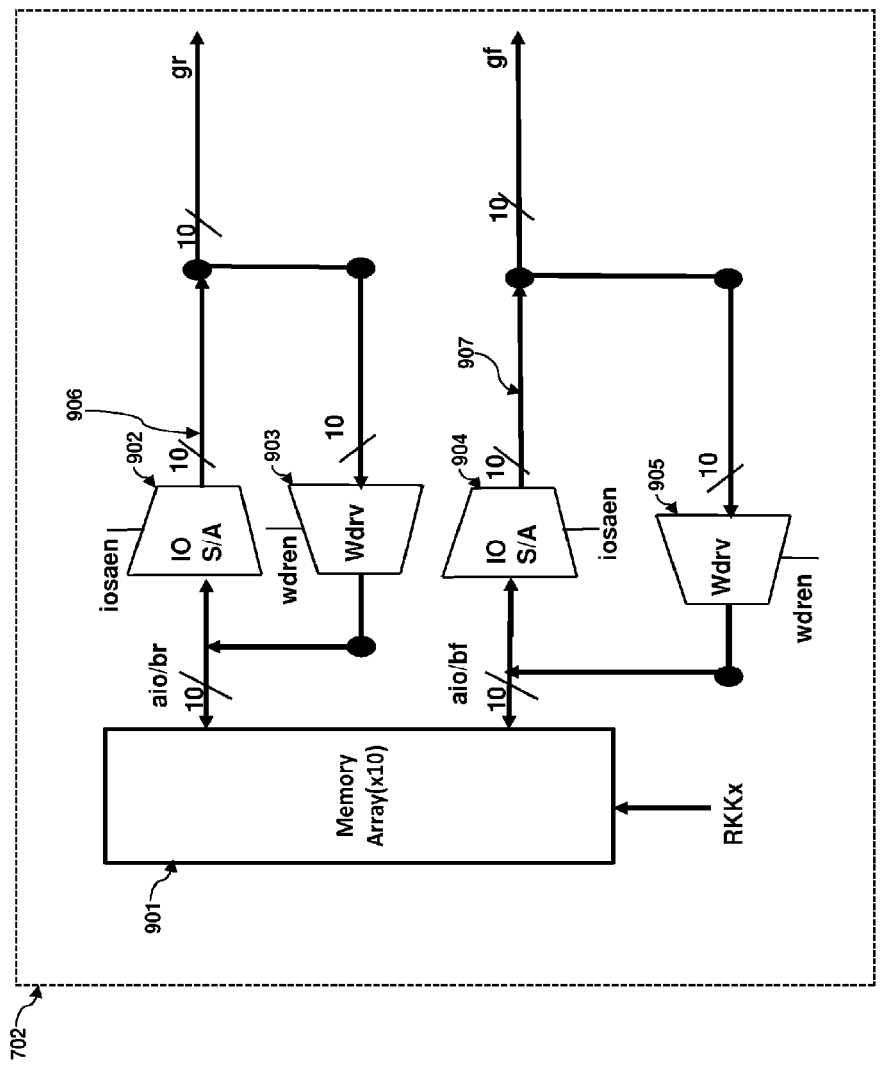

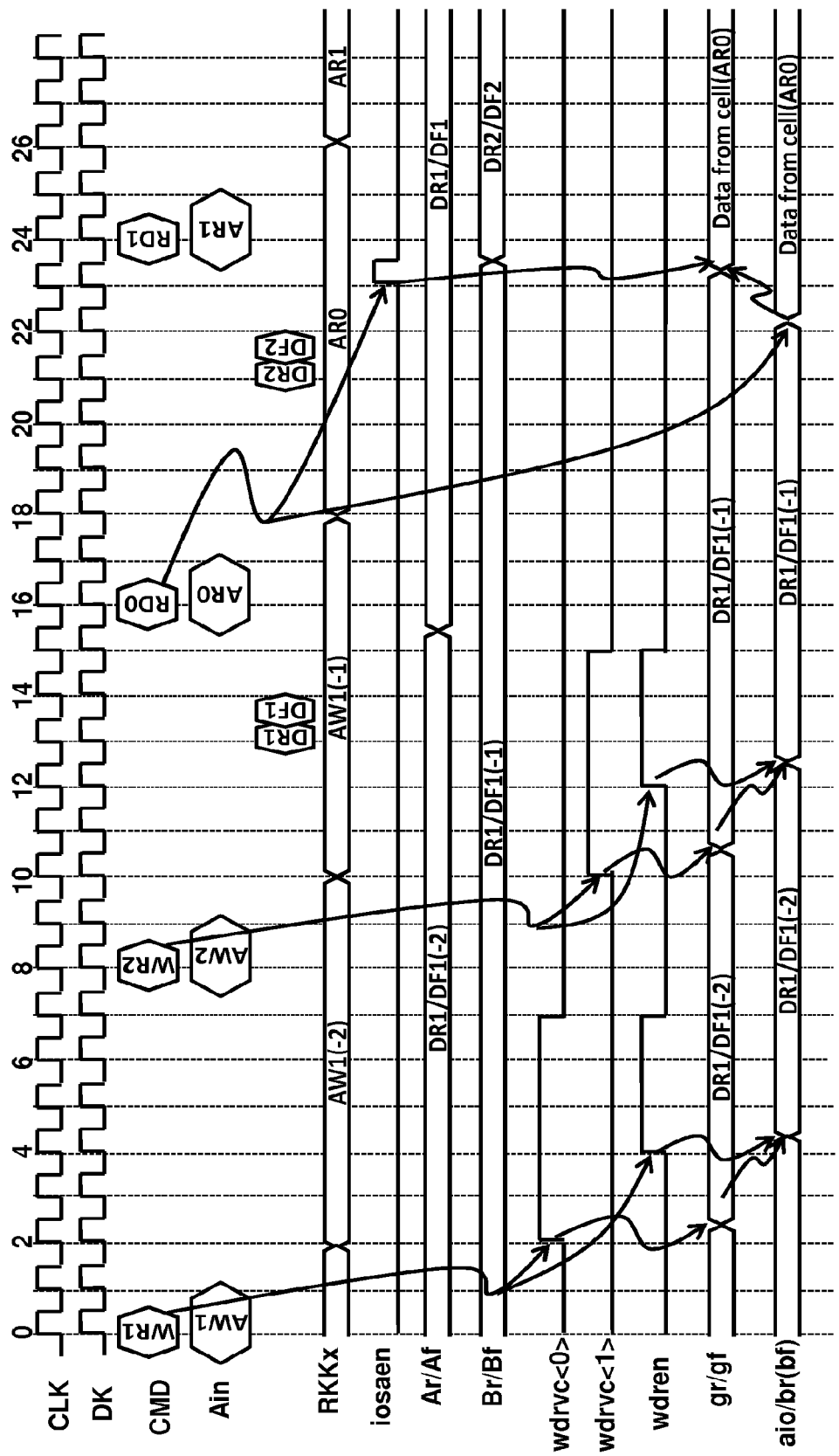
Fig. 9b Timing Diagram of Memory Array and IO S/A, Wdrv
TRC=8, BL=2, TRL=12, TWL=13, DI=1, LLDRAM

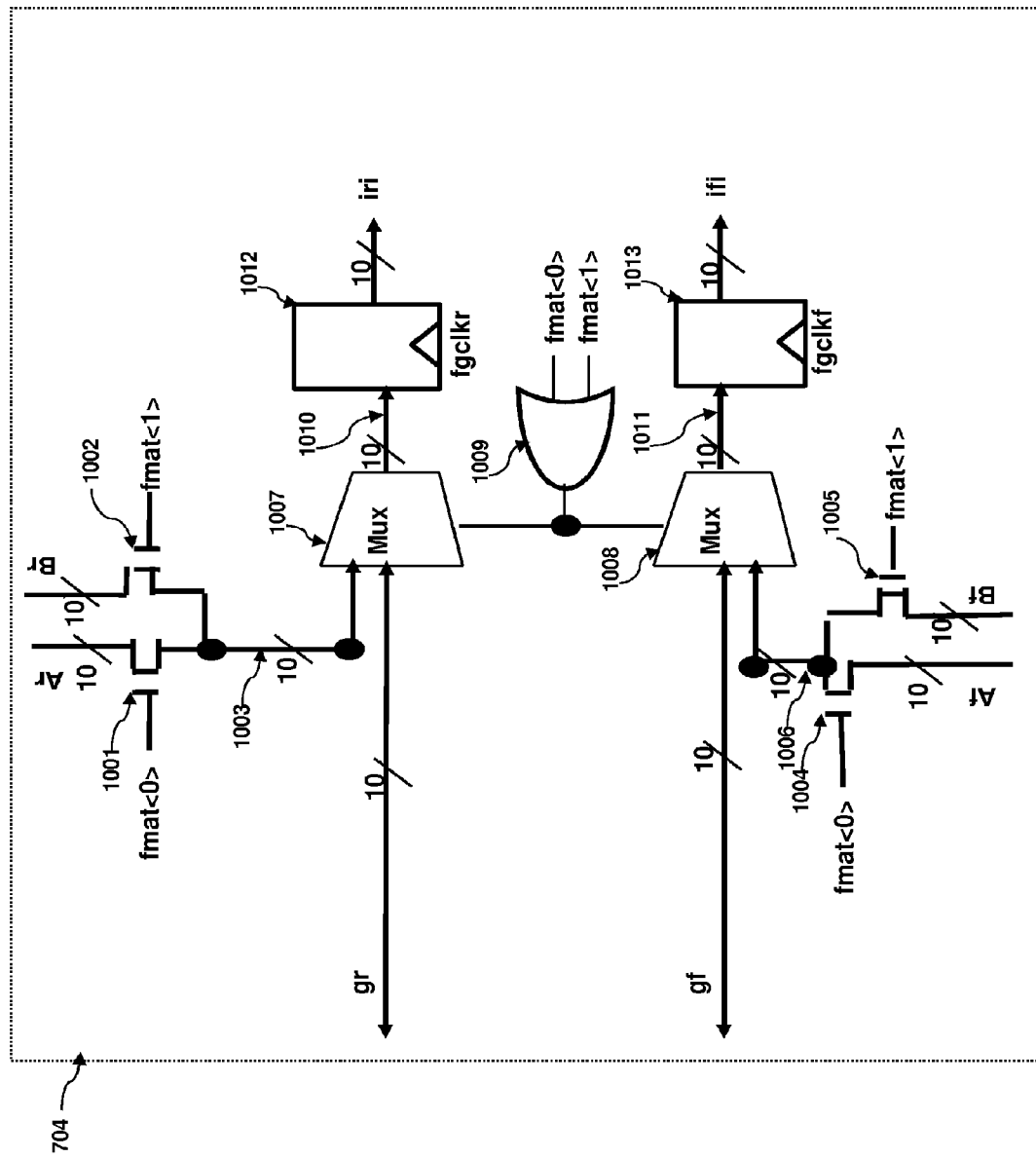
Fig. 10 Read unit

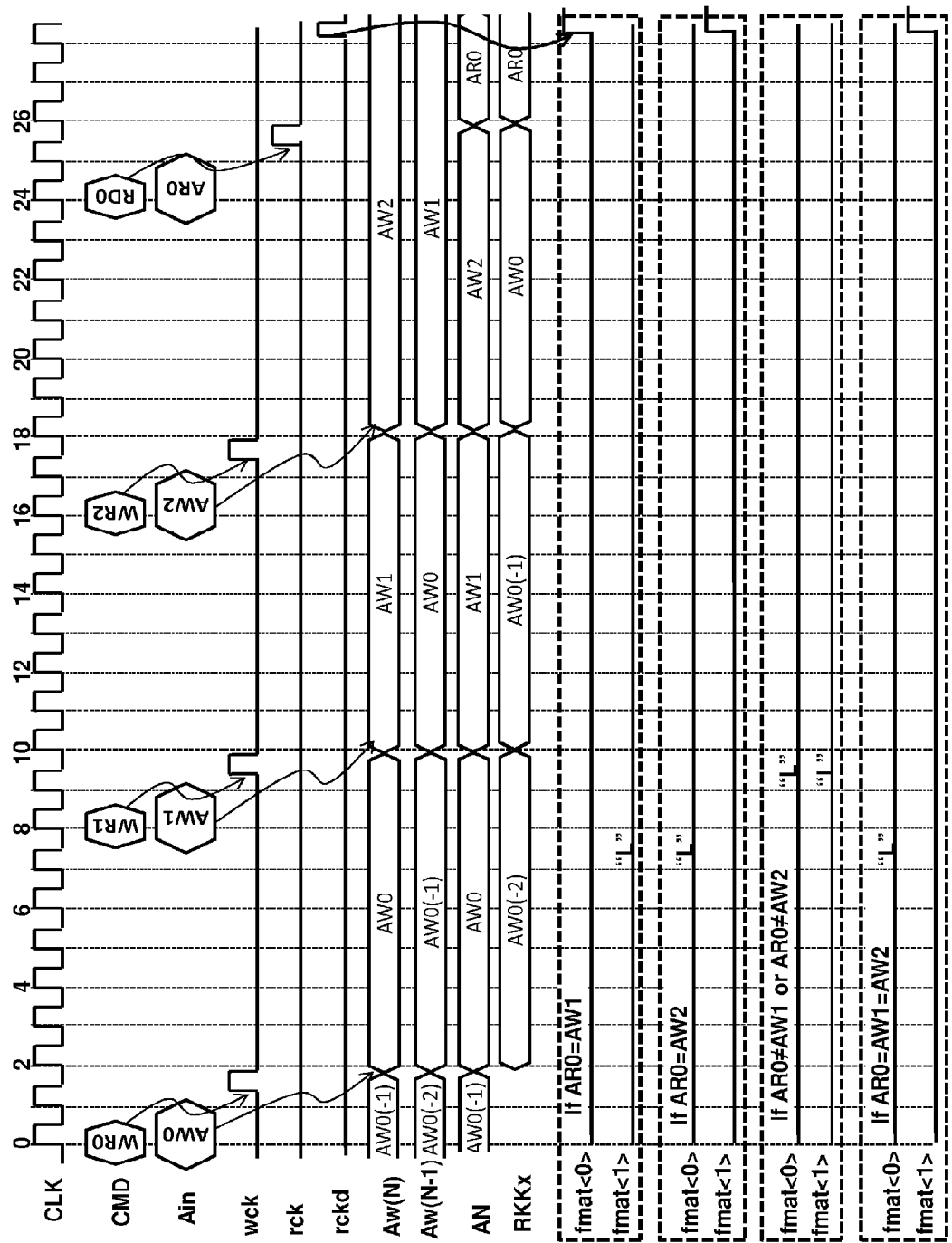
Fig. 11b Timing diagram of Address and match unit
TRC=8, BL=2, TRL=12, TWL=13, DI=1, LLDRAM

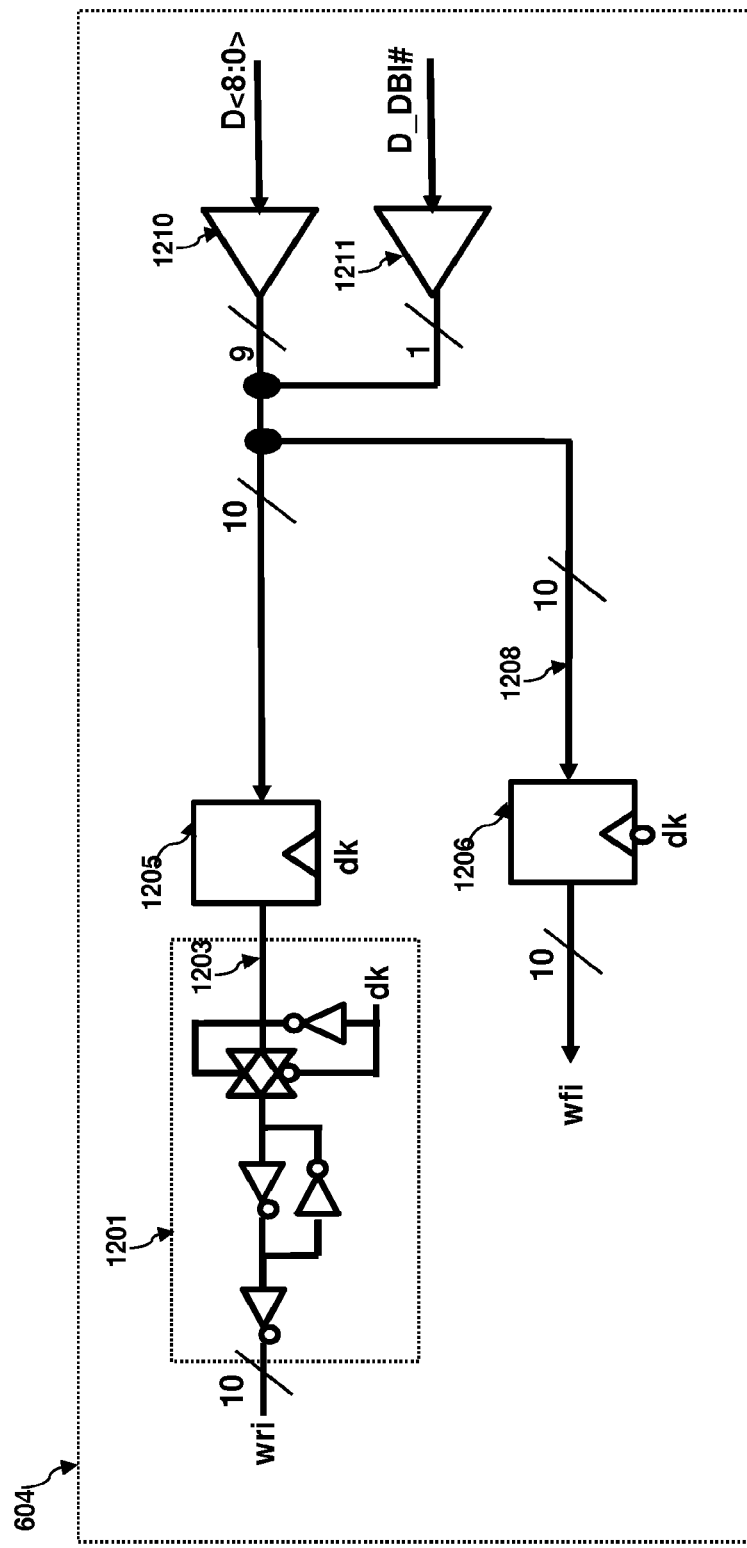
Fig. 12a Data input buffer

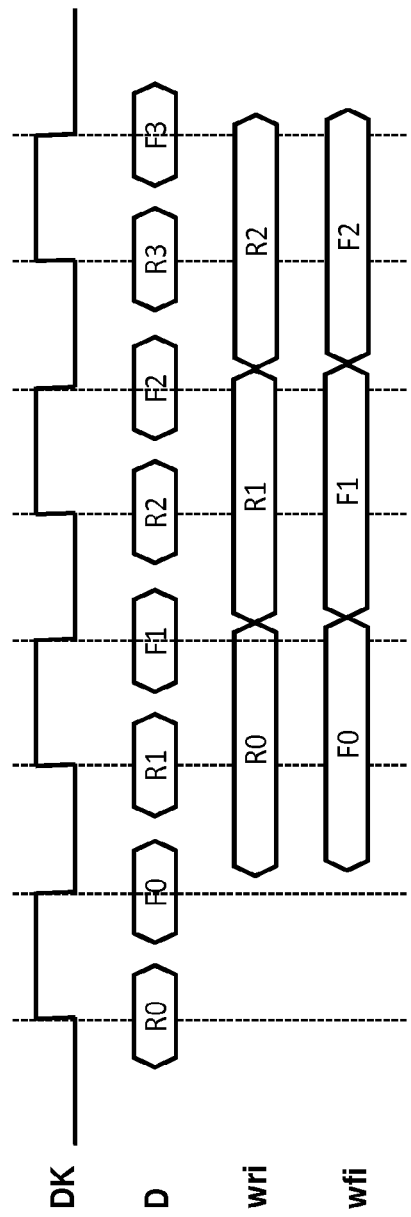
Fig. 12b Timing Diagram of Data input buffer
TRC=8, BL=2, TRL=12, TWL=13, DI=1, LLDRAM

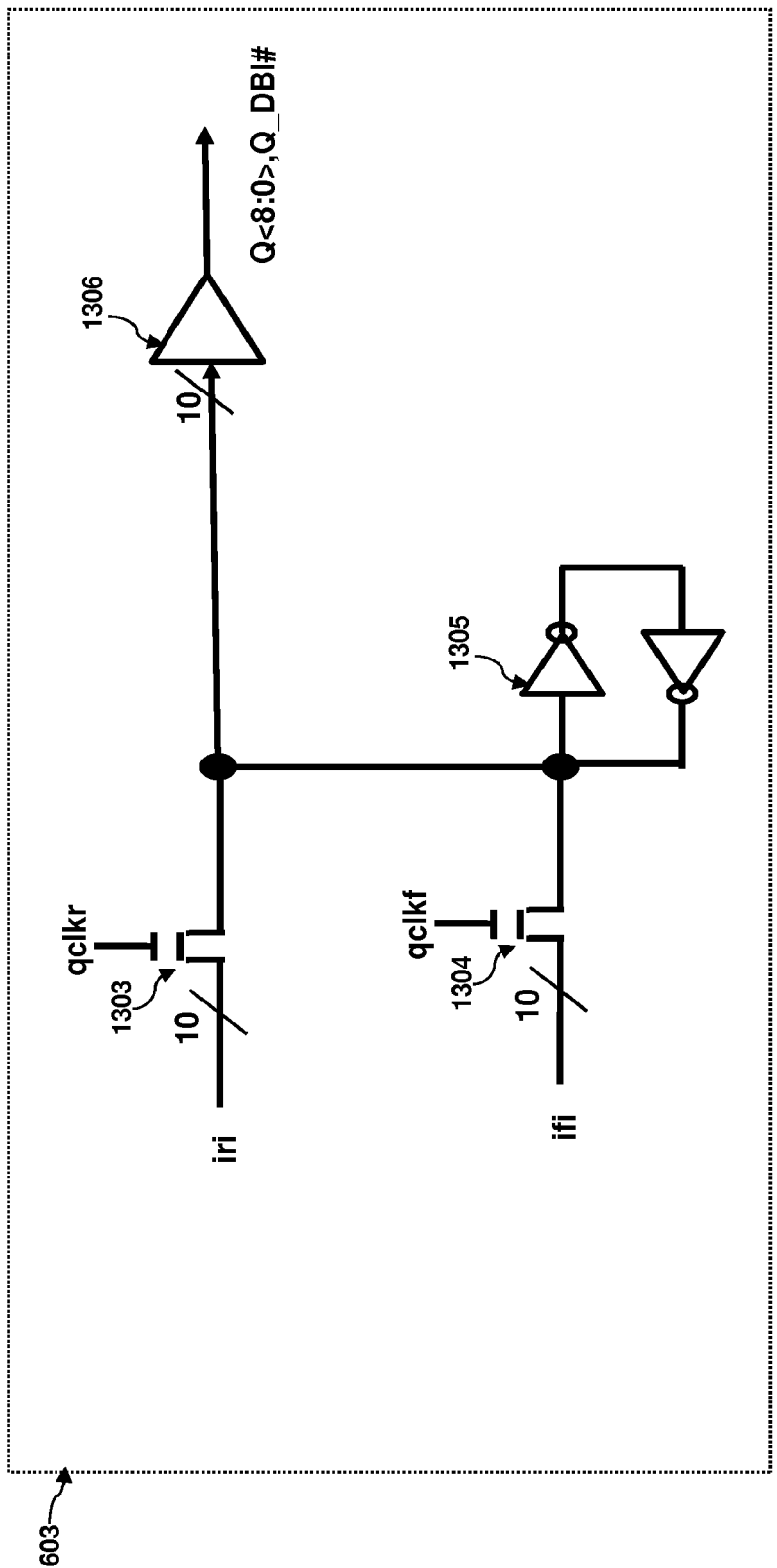
Fig. 13 Data output buffer

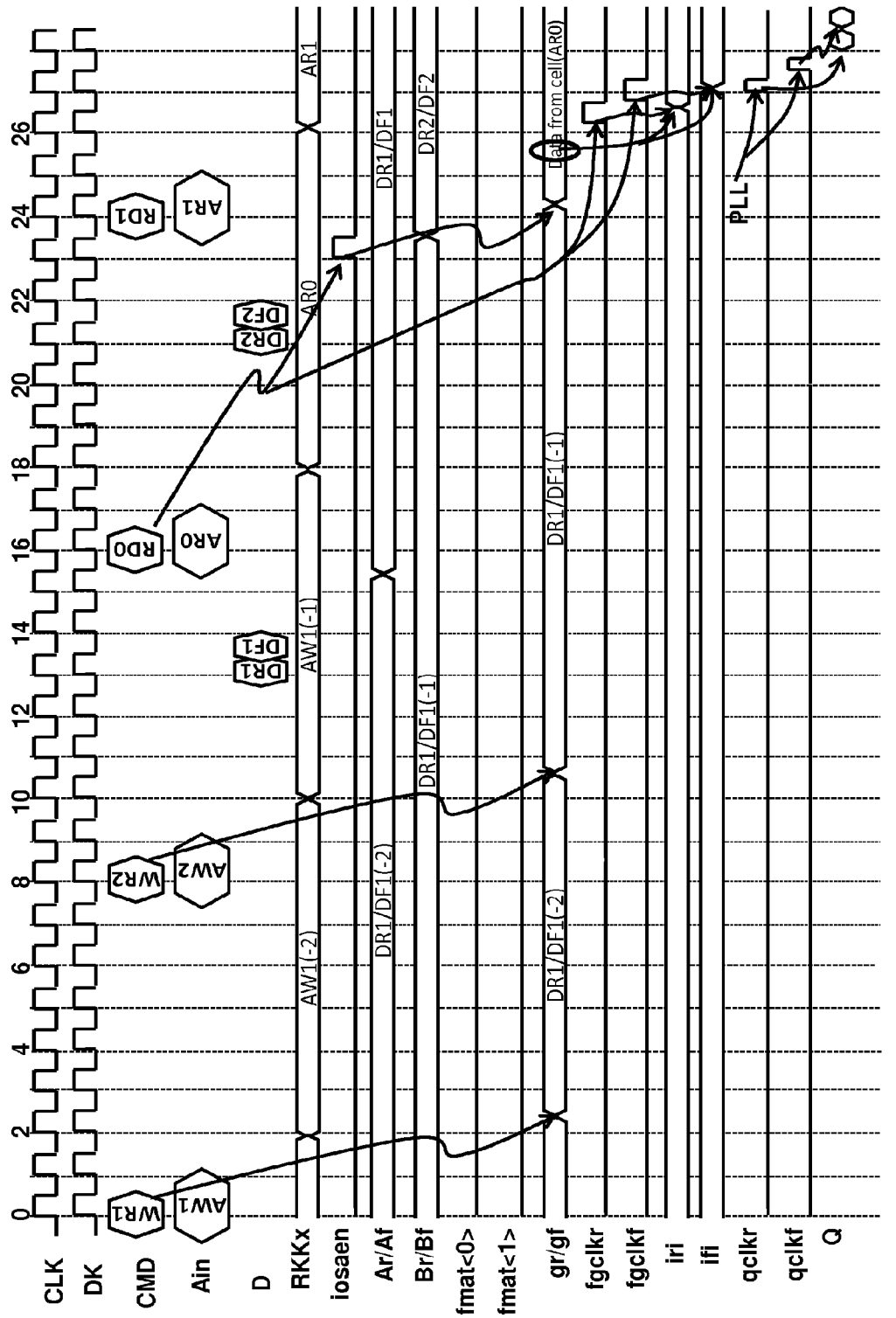
Fig. 14 Timing Diagram of Read unit & Data output buffer(Read cycle)
TRC=8, BL=2, TRL=12, TWL=13, DI=1, LLDRAM, AR0≠AW1 and AR0≠AW2

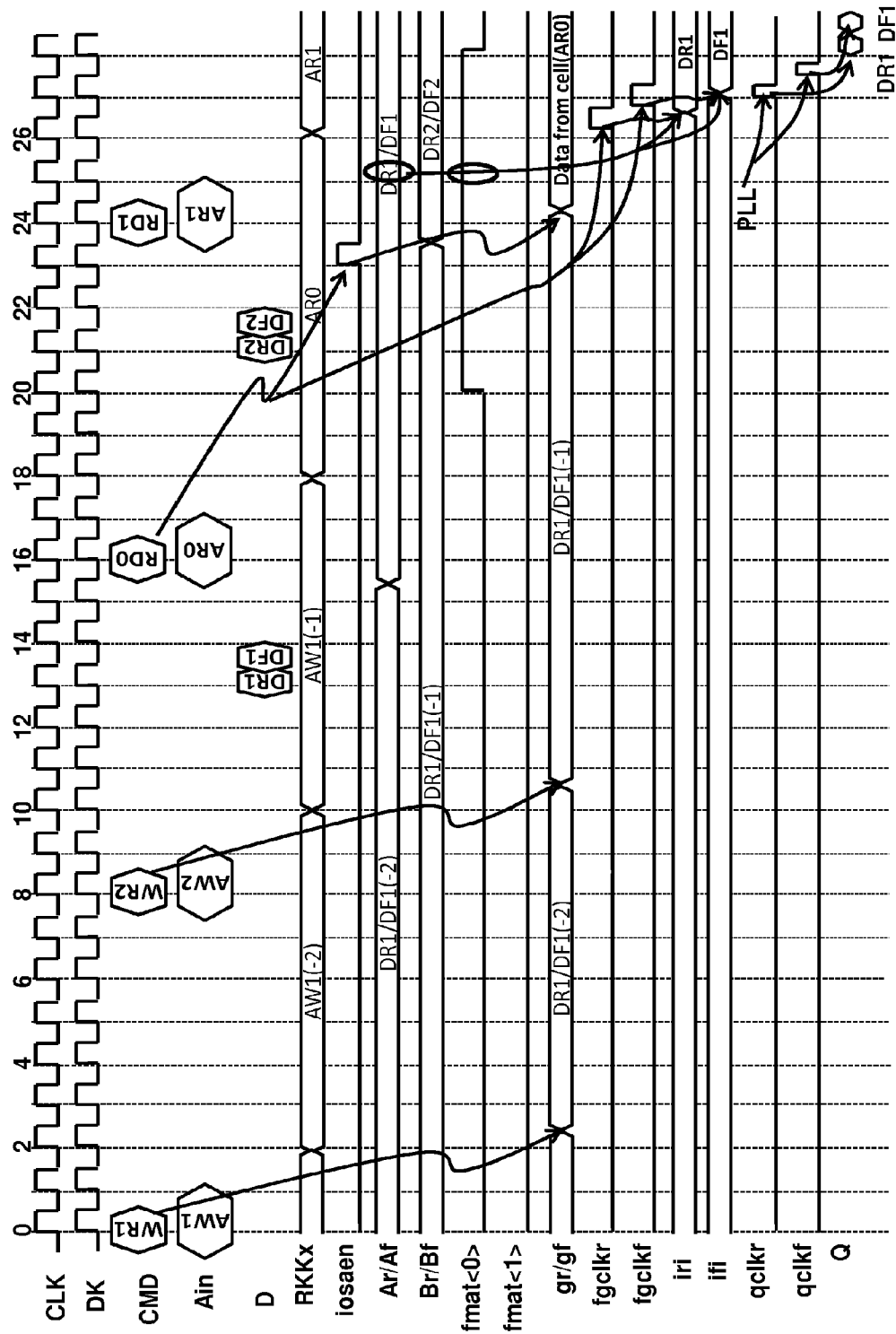
Fig. 15 Timing Diagram of Read unit & Data output buffer(Read cycle)
TRC=8, BL=2, TRL=12, TWL=13, Dl=1, LLDRAM, AR0=AW1 and AR0≠AW2

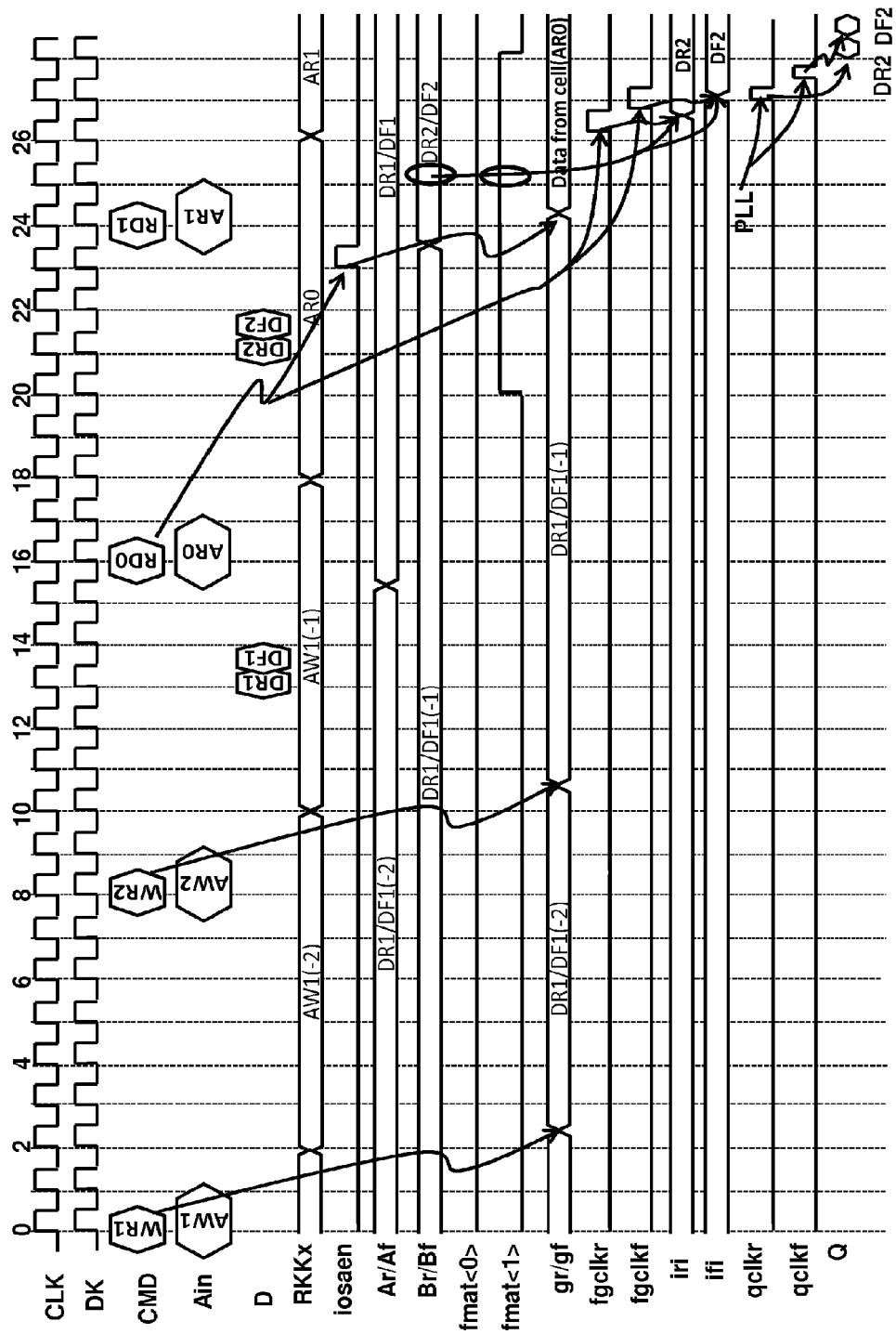

US 10,192,592 B2

SYSTEMS AND METHODS INVOLVING DATA BUS INVERSION MEMORY CIRCUITRY, CONFIGURATION AND/OR OPERATION INCLUDING DATA SIGNALS GROUPED INTO 10 BITS AND/OR OTHER FEATURES

CROSS-REFERENCE TO RELATED APPLICATION INFORMATION

This is a continuation of U.S. Non-provisional application Ser. No. 14/217,343, filed Mar. 17, 2014, which claims benefit of/priority to provisional patent application No. 61/801,486, filed Mar. 15, 2013, each of which is incorporated herein by reference in its entirety.

BACKGROUND

Field

The present innovations relate generally to data bus inversion, and, more specifically, to systems and method of data bus inversion associated with memory configuration and/or operation involving data signals grouped into 10 bits.

Description of Related Information

Data bus inversion (DBI) is an interface scheme capable of reducing simultaneous switching noise, as well as AC current and DC current drain and associated problems. In DBI schemes with data signals grouped into 10 bits, for example, when half or more 10 pins are low (i.e. 0) in the binary bus, a DBI pin (e.g., DBI#) signaling the data bus inversion is set to low (i.e. 0) and the data bus is inverted in the DBI bus. When DBI# is set to zero, this indicates an inverted data bus, occurring when half or more bits in the DBI bus are high. Inversion is performed on the data bits by DBI logic circuitry based on the DBI pin. Since no more than half of the bits can switch under the DBI scheme, then no more than half of the 10 bits consume AC power. The output in the DBI scheme is normally set to be terminated to high level through resistive connection to VDD supply, and DC current due to output termination is also reduced because no more than half of the outputs can be at low level.

FIG. 1 illustrates current switching of an existing internal 9 bit data bus. The maximum current switching is performed when all 9 bits switch from low to high in one cycle and from high to low the next cycle. When all 9 bits switch in the same direction, IDD and ground current are at a maximum level and therefore cause a current spike, which in turn causes VDD to drop and causes ground bounce through the power bus resistors R1 and R2. This, in turn, reduces the switching speed. So although an external data bus adopts a DBI scheme to reduce DC and AC current and SSO (Simultaneously Switching Output) noise, the conventional design converts the external data bus to the normal data bus that is still noisy with all bits switching.

An example of a conventional memory system incorporating DBI logic is provided in FIG. 2. Here, both DBI formatter circuitry 245 and DBI converter circuitry 241 are provided at each of the inputs and outputs of the memory core 244 of the memory chip 210. Likewise, the corresponding outputs and inputs of the memory controller 220 includes both the DBI formatter circuitry 245 and DBI converter circuitry 241. In this manner, DBI processing is performed between logic 221 and memory 244. The data stored in memory 244 does not include any DBI information. Conventionally, DBI converter circuitry 241 or DBI formatter circuitry 245 is provided in the memory controller 220 and paired with a corresponding DBI formatter 245 or DBI converter 241 within the memory chip 210.

Other existing DBI logic circuitry is provided in FIGS. 3A and 3B, which illustrate DBI formatter logic and DBI converter logic, respectively. The DBI formatter logic of FIG. 3A receives inputs of nine data bits provided from a memory core and a DBI mode enabling signal DBIe#, and outputs the data bits with a one bit DBI pin DBI# indicating data inversion or non-inversion based on the quantity of the low data bits. DBIe# signal can be supplied from the external pin or from an internal mode register. The DBI converter logic of FIG. 3B receives inputs of nine data bits with the DBI pin DBI# and DBIe#, and outputs the data bits being inverted, or not, as a function of DBI# and DBIe#.

FIG. 4A illustrates one such conventional circuit design 440 implementing DBI logic. During a write cycle, for example, nine bit data DQ and one bit DBI pin DBI# is received and is processed through DBI converter logic 441 and outputted as a signal Din that is inverted if the DBI# is set to low. The data bits are then processed through Section Data 442 and outputted as section data sd, input to column pass gate 443, and then written into the memory core 444. During a read cycle, the stored nine bit core data is processed through the column pass gate 443 and outputted as ssl, sensed in the Section circuitry 442 and outputted on the sense line SL. The DBI formatter logic 445 then outputs a DBI pin DBI# and the nine bit data DQ. Further, FIG. 4B is a diagram illustrating exemplary circuit components of the memory core 444, column pass gate 443 and section circuitry 442.

Such conventional systems and methods, however, possess certain drawbacks and/or inefficiencies in processing the DBI bit and associated data into and out of the memory cell. These deficiencies lead to various issues, such as unnecessary power consumption, and/or as undesired current fluctuations and noise, among others drawbacks. As such, there is a need for systems and methods that may provide advantageous reduction of simultaneous switching noise, reduction of IDD current and/or IDD current spike issues, and/or removal of delay(s) due to DBI conversion, among other innovations.

BRIEF DESCRIPTION OF THE DRAWINGS

The accompanying drawings, which constitute a part of this specification, illustrate various implementations and aspects of the innovations herein and, together with the description, help illustrate the principles of the present inventions. In the drawings:

FIG. 2 is a block diagram of an existing memory circuit incorporating DBI.

FIG. 3a is a schematic diagram of existing DBI formatter logic.

FIG. 3b is a schematic diagram of existing DBI converter logic.

FIG. 4b is a circuit diagram of an existing DBI circuit.

FIG. 6*b* is a block diagram depicting illustrative address buffer circuitry 605, consistent with one or more aspects of the innovations herein

FIG. 8*b* is a timing diagram depicting illustrative write coherency register timing aspects, consistent with one or more aspects of the innovations herein.

FIG. 9*a* is a block diagram showing an illustrative logic diagram of exemplary memory array and I/O sense amplifier circuitry 702 consistent with aspects related to the innovations herein.

FIG. 9*b* is a timing diagram depicting illustrative exemplary memory array and I/O sense amplifier circuitry timing aspects, consistent with one or more aspects of the innovations herein.

FIG. 10 is a block diagram showing an illustrative logic diagram of exemplary read circuitry 704 consistent with aspects related to the innovations herein.

FIG. 11*b* is a timing diagram depicting illustrative exemplary addressing and matching circuitry timing aspects, consistent with one or more aspects of the innovations herein.

FIG. 12*a* is a block diagram showing an illustrative logic diagram of exemplary data input buffer circuitry 604 consistent with aspects related to the innovations herein.

FIG. 12*b* is a timing diagram depicting illustrative exemplary data input buffer circuitry timing aspects, consistent with one or more aspects of the innovations herein.

FIG. 13 is a block diagram showing an illustrative logic diagram of exemplary data output buffer circuitry 603 consistent with aspects related to the innovations herein.

FIG. 14 is a timing diagram depicting illustrative read timing aspects when read address is not matching with the write addresses in write coherency registers, consistent with one or more aspects of the innovations herein.

FIG. 15 is a timing diagram depicting illustrative read timing aspects when read address is matching with one of the write addresses in write coherency registers, consistent with one or more aspects of the innovations herein.

FIG. 16 is a timing diagram depicting illustrative read timing aspects when read address is matching with both of the write addresses in write coherency registers, consistent with one or more aspects of the innovations herein.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

Figure 5A:
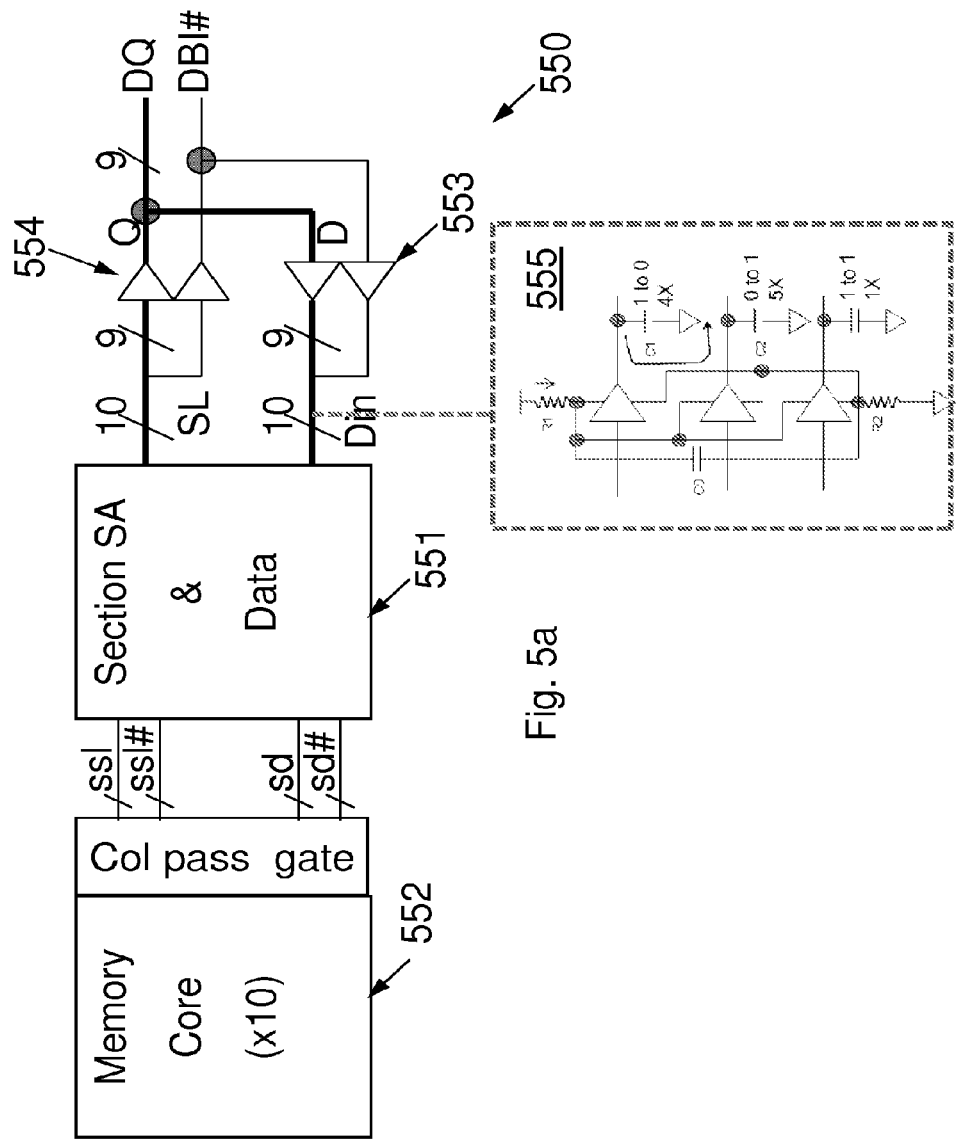
FIG. 5a is a block diagram showing illustrative data bus inversion aspects in an exemplary memory device consistent with one or more aspects of the innovations herein.

FIG. 5*a* is a block diagram showing illustrative data bus inversion aspects in an exemplary memory device consistent with one or more aspects of the innovations herein. Referring to FIG. 5*a*, a first aspect of the innovations of a memory device that receives a 9 bit data bus with DBI scheme and a DBI# input are illustrated. Here, the illustrative memory device 550 shown includes one or more sections with SA (Sense Amplifier) and Data driver 551 and a memory core 552. The memory device is decoded into sections to reduce the number of word lines and bit line length in order to achieve higher speed and consume less power.

As shown in FIG. 5*a*, the illustrative memory device 550 may include a memory core 552 and input circuitry 553 that receives a data bus inversion (DBI) bit associated with a data signal as input directly, i.e., without transmission through DBI logic associated with an input buffer. Further, at least one memory circuit, such as section circuitry 551, may store the DBI bit into the memory core 552, reads the DBI bit from the memory core 552, and provides the DBI bit as output. According to implementations herein, the memory device 550 stores and processes the DBI bit on an internal data bus as a regular data bit.

Turning to exemplary operation of such circuitry, during one illustrative write cycle, 9 data bits and the one bit DBI# is received from pins, and pass through input buffers and drivers 553 to generate a 10 bit Din bus. The input buffers and drivers 553 may contain input registers or latches for synchronous memory. In the 10 bit Din bus, 9 data bits and the one bit DBI# are treated the same as a 10 data bit memory device. The 10 Din bits are then decoded in Section SA & Data 551 to generate 10 sd (Section Data) and sd# (complementary sd) pairs. The sd and sd# pairs may then be further decoded via a column decoder and through a column pass gate and then written into a 10 data bit Memory Core 552.

Further, during one illustrative read cycle, the 10 data bits from Memory Core 552 are accessed through the decoded section, where the signals pass through the column pass gate. Next, the signal are received by Section SA & Data 551 for sensing and amplification, and then outputted as 10 bits of SL (Sense Line) bus. Here, the 10 bit SL bus comprises 9 data bits and one DBI# bit. The SL bus is then buffered and driven by output buffer 554 as outputs. Further, output buffer 554 may contain output registers or latches for Synchronous memory. In such manner, memory devices herein may thereby be configured to store and process the DBI bit as a regular data bit. Accordingly, regular data bits are not converted through DBI converter logic on the write cycle and do not need to be converted by DBI formatter logic on the read cycle as set forth in FIG. 4A.

With respect to write operation, the Din bus may be a heavily loaded global line. As set forth herein, present implementations may have only 5 data bits switching one way and the other 5 bits switching the other way as a maximum number of bits switching. Therefore, switching noise is reduced compared to all 9 bits switching without including DBI# as part of the Din bus as done in existing circuitry. Switching noise is further reduced when all 10 bits of the Din driver are grouped together to share a common decoupling capacitor from VDD to Ground due to the complementary switching nature, as shown and described in more detail below in connection with FIG. 5*b*. The reduced switching noise on VDD and Ground thus provide good power supply to speed up the Din bus. The write speed is also improved over the conventional art due to the absence of DBI converter logic. In addition, the AC current is reduced due to the complementary switching nature that 1 to 0 switching Din lines also contribute to charge up from 0 to 1 Din lines through the decoupling capacitor (see, e.g., FIG. 5b).

Figure 5B:
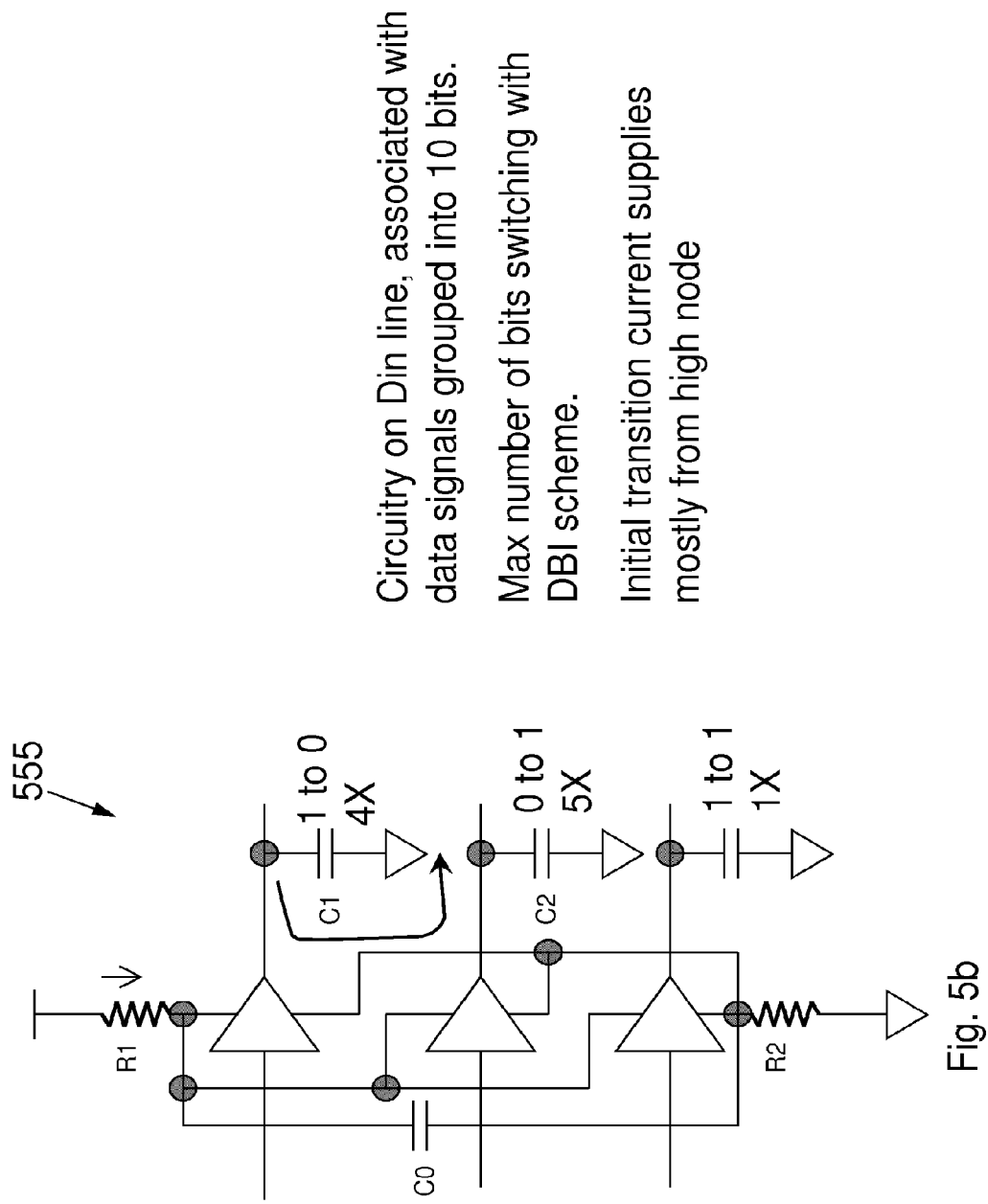
FIG. 5b is circuit diagram of an illustrative switching circuit for data bus inversion schemes consistent with one or more aspects of the innovations herein.

FIG. 5b illustrates an example of a DBI scheme for an internal data bus with a 9 bit data pin and one bit DBI#. Such circuit configuration(s) may be utilized in other implementations, as illustrated and described elsewhere herein. Referring to FIG. 5b, a first state may be defined where DBI# is set to zero and the data has a combination of 4 low bits and 5 high bits (i.e., data=000011111 and DBI #=0). In a first state of such illustrative configuration, 4 bits from among the data and DBI# are set to low, or pull down. Further, a second state may be defined where DBI# is set to one and the data pin has a combination of 4 low bits and 5 high bits (i.e, data=111110000 and DBI #=1). In switching from the first state to the second state, 5 bits from among the data bits and DBI# switch from 0 to 1 and 4 bits of data switch from 1 to 0. Next, in switching from the second state to the first state, 4 bits of data switch from 0 to 1 and 4 data bits and DBI# switch from 1 to 0.

As such, according to implementations herein, in switching from the first state to the second state or vice versa, the average number of bits switched from low to high is 4.5, which is the same number as the maximum number of bit switches without DBI scheme. However, the maximum number of bits switched occurs when there are 4 to 5 bits switching from high to low with the other 5 to 4 bits switching from low to high. This is referred to as complementary output switching where current spike induced switching noise can be mostly eliminated and AC power can be greatly reduced. As set forth in connection with FIG. 5b, when the lump capacitance C1 loading of four data bits is discharging, the lump capacitance C2 of five data bits charges at the same time such that the charges flow from C1 to C2 through decoupling capacitor C0. Partial of the C2 charges required to reach a high level can be supplied from C1 through C0, thereby reducing the supply requirement from VDD and Ground. Thus, the internal data bus DBI scheme improves speed, reduces AC noise, and reduces AC power, in part due to the complementary driving nature of these innovations.

Figure 1:
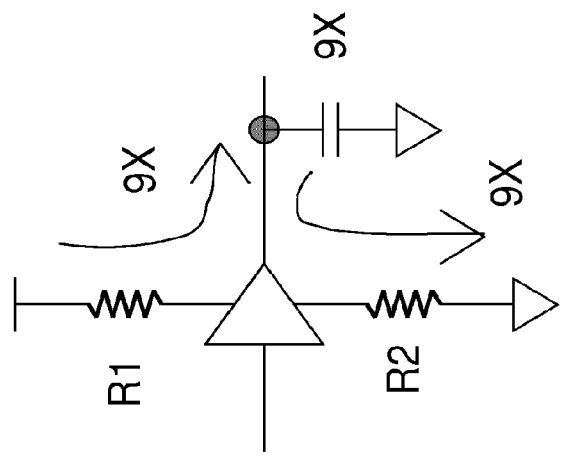
FIG. 1 is a circuit diagram of an existing switching circuit for a non-DBI scheme.
Figure 4A:
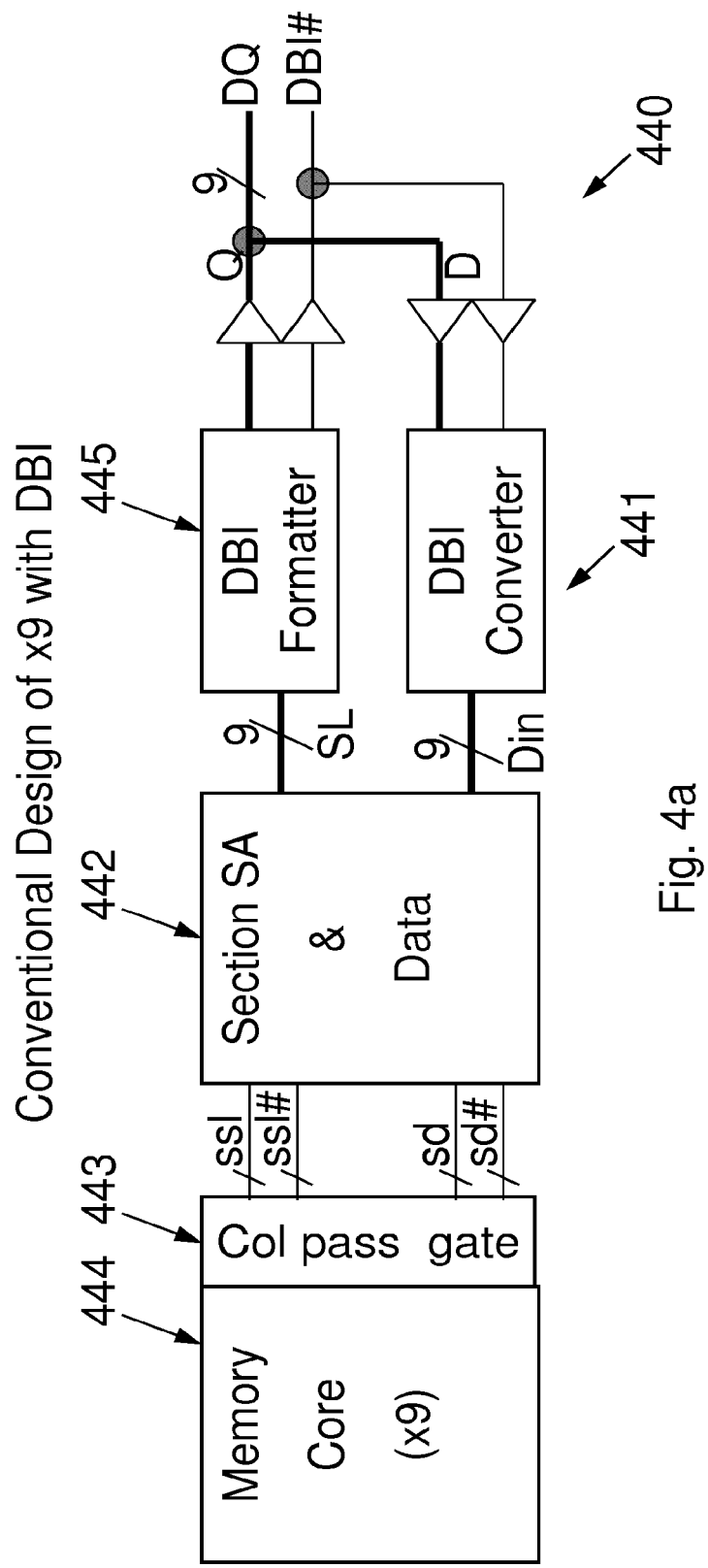
FIG. 4a is a block diagram of an existing DBI circuit.

Turning back to further operation consistent with the example of FIG. 5a, in the read operation, the SL bus may be a heavily loaded global line. Here, section SA receives a differential signal pair of ssl and ssl# and outputs a single ended SL. To fully utilize the DBI scheme, the SL is pre-charged to 1 before SA operation. After sense, if the data is 1, then the SL will stay as 1; if the data is 0, the SL will switch to 0. Such implementations with DBI included SL have a maximum of 5 bits switch from pre-charged state of 1 to final state of 0, while half of the 10 data bits SL stay as 1. By contrast, all 9 bits of SL could switch from the pre-charged state to the final state in the prior art. Consequently, the reduced SL line switching reduces AC current and also reduces current switching noise and thus improves speed. The read operation speed is further improved with SL going straight to output without processing by any DBI formatter logic, as is required in existing systems such as shown in FIGS. 4A and 4B. Compared to existing circuitry, innovations herein include one extra data bit to the 9 data bit memory core as chip size overhead. However, in order to achieve high speed, the state of the art memory is designed to comprise of 8 or 16 banks, and each bank is further sectioned. The memory core efficiency is therefore less than 30% due to the banking overhead. The memory core efficiency is measured by the memory cell area divided by the chip area. So the memory core overhead with one extra data bit of the otherwise 9 bit memory core results in only a 6.6% chip size penalty.

The chip size penalty can be described as the table below

|  | W/O DBI | With DBI |
|---|---|---|
| Periphery | 70% | 73.3% |
| Memory core | 30% | 33.3% |
|  |  | (1 DBI for every 9 memory bit) |
| Total Die Size | 100% | 106.6% |

Consistent with such features, present implementations may also provide a high bandwidth capability with wide IO configurations. For example, x36 IO with a burst length of four memory may be implemented into an internal x144 configuration. The present inventions describe a DBI scheme of one DBI# for every 9 IO. Next, a x144 configuration may contain sixteen groups of x9 IO with a DBI# signal in each group to become x160 configuration. If there is one DBI# for every eighteen TO, then x144 IO configuration contains eight groups of x18 IO with the DBI# signal in each group to become x152 configuration. The total number of DBI bit on 144 bit wide IO organization can therefore be reduced from 16 to 8 when the memory bit grouping for DBI is increased from 9 to 18.

According to implementations herein, a memory core may be coupled to a data bypass circuit including a write buffer storing addresses and comparator circuitry comparing a read address to the addresses stored in the write buffer. Data from the write buffer is retrieved instead of data from the memory array when, e.g., comparator circuitry determines that the address stored in the write buffer matches the read address.

Figure 6A:
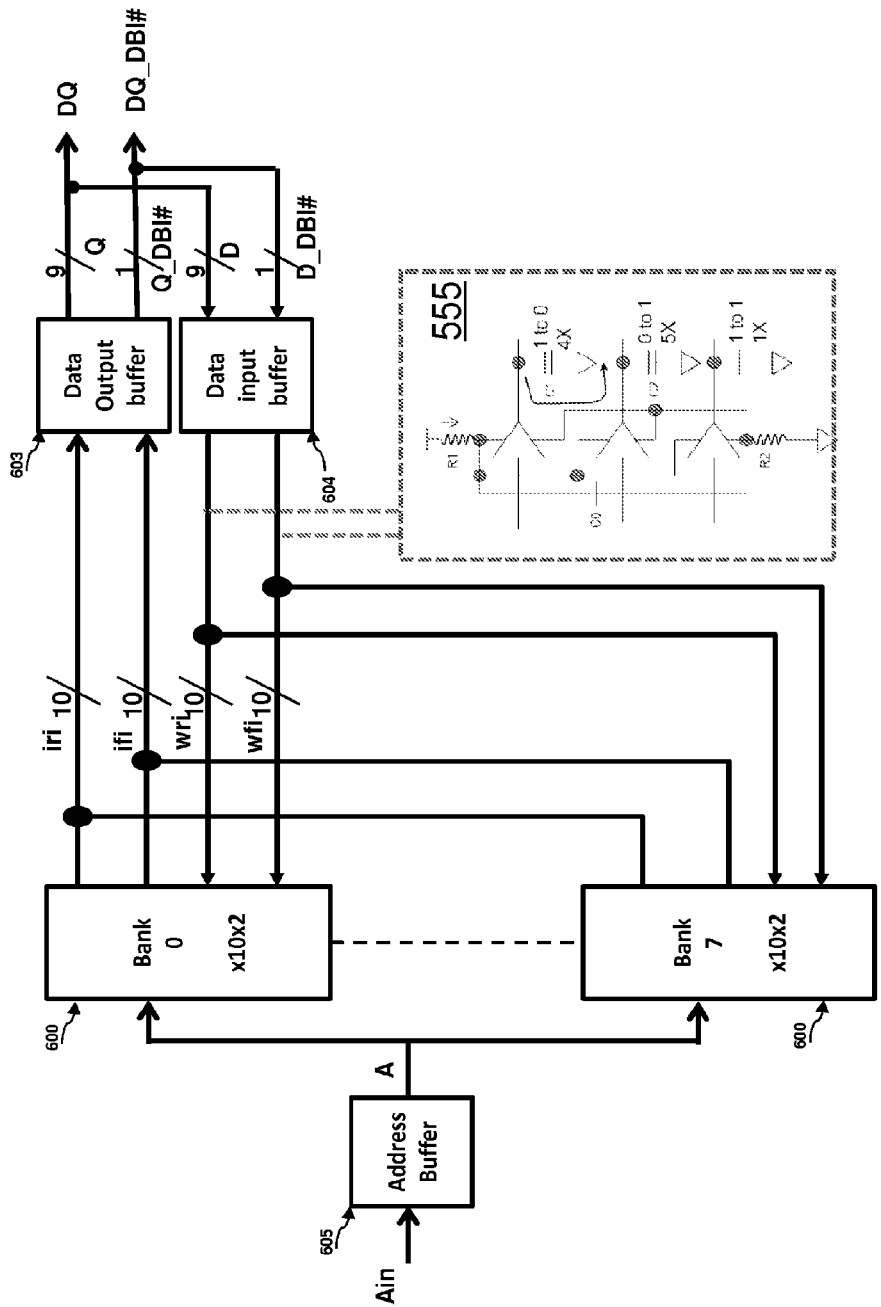
FIG. 6a is a block diagram depicting exemplary circuitry showing an illustrative data bypass implementation with DBI data stored in memory as a 10th bit, consistent with one or more aspects of the innovations herein.

Next, an implementation of an illustrative low latency dynamic random access memory (LLDRAM) with data signals grouped into 10 bits will be discussed below. FIG. 6a is a block diagram depicting illustrative circuitry showing an illustrative LLDRAM data bypass implementation with DBI data stored in memory as a 10th bit, consistent with one or more aspects of the innovations herein. As set forth in FIG. 6a, an example of the implementation of a 8 banks x9, BL2 (Burst Length 2) Common IO DRAM is provided with DBI data stored in memory as 10th bit. The exemplary circuit has the performance of tRC (Random access Cycle time)=8 (cycles), RL (Read Latency)=12 (cycles), WL (Write Latency)=13 (cycles).

Referring to FIG. 6a, such memory may be organized as eight banks 600, numbered Bank 0 to Bank 7. The address input Ain is received by Address buffer 605 and output internal address bus A to eight memory banks. The eight banks receive the same address bits except for each individual bank address bits. Since there are eight banks, there are 3 bits of bank address. During the memory operation, each bank 600 can receive its unique bank address 1 out of every 8 clock cycles. Further, each bank can complete a random address access cycle time every 8 cycles, or tRC=8. Because each bank's tRC=8, the chip can operate on every cycle with 8 banks, as long as each bank is not addressed again in less than an 8 cycle period. Next, RL=12 means that an output address access time is 12 cycles; WL=13 means that the data input is inputted 13 cycles after the corresponding write command and write address are inputted. BL2 means that there are 2 beats of data outputs or data inputs, or referred as DDR (Double Data Rate) data operated on every clock cycle. As such, even though tRC=8, RL=12 and WL=13, because of the 8 bank organization, circuitry and chips herein may read or write DDR data on every clock cycle. In other words, the random access cycle time of present innovations can be operated in $\frac{1}{8}^{th}$ of the random access cycle time of the memory bank, as long as each bank is not accessed again within 8 cycles. Systems and methods herein may also have other configurations. For example, BL may be 4 or 8, and tRC, tRL and tWL may have different specifications. The present inventions also apply to such different configurations, in consonant manner to the illustrative implementations detailed herein.

As set forth in FIG. 6a, 9 bits of DDR data D and D_DBI# are inputted into the chip through Data input buffer 604. Here, for example, D_DBI# may be the DBI bit of data D. On a write cycle, DDR data D and D_DBI# are strobed through Data Input buffer 604 into 10 bits wide of "wri" and "wfi" buses. The wri bus includes the 1st DDR data of D and D_DBI# coming at the rising edge of an external clock and wfi includes the 2nd DDR data of D and D_DBI# coming at the falling edge of the external clock, or at the rising edge of an external complementary clock. The buses wri and wfi then send the data to the corresponding bank and are stored as 20 bits wide memory. The extra 2 bits stored other than data D are the DDR data of D_DBI#. On a read cycle, 10 bits wide of iri and ifi are read out from the 8 banks in parallel, and then go through Data output buffer 603 to send out as DDR formatted Q_DBI# and 9 bits wide Q.

FIG. 6b is a block diagram depicting illustrative address buffer circuitry, consistent with one or more aspects of the innovations herein. The address input Ain is a double data rate address bus, half of the address is received at the rising edge of the clock and the other half of the address is received at the falling edge of the clock, or at the rising edge of the complementary clock. So the width of the address bus is only needed to be half of required. As example, 13 addresses of Ain<12:0> are stored by register/latch 611 at the rising edge of clock clk. The output of register 611, 614, is then latched by the Latch 613. The output of Latch 613, A<12:0> is available at the falling edge of clk, as half of A<25:0>. Ain <12:0> changes to the other half of address at the falling edge of clk and is stored by register/latch 612. The output of register/latch 612, A<25:13> is available at the falling edge of clk and form the other half of A<25:0>. So all bits of the address bus are stored and are ready to send to memory banks at the falling edge of clock clk. In summary, the address bus Ain inputs half of address in each half of the clock every cycle, and the address buffer 613 receives the address Ain at both half of the clock and outputs internal address A at the second half of clock clk to send to eight memory banks 600.

Figure 7:
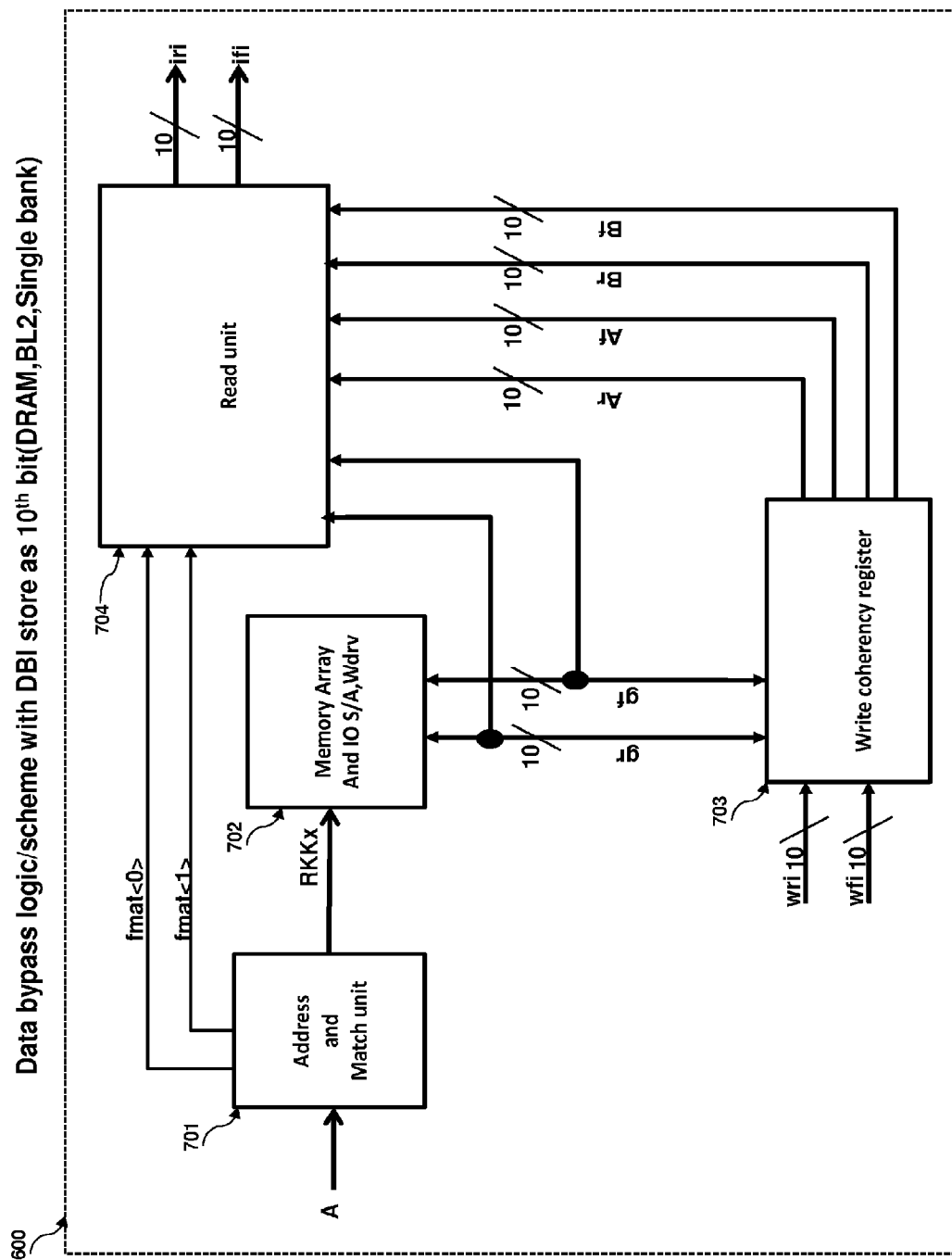
FIG. 7 is a block diagram depicting illustrative memory bank circuitry, consistent with one or more aspects of the innovations herein.

FIG. 7 is a block diagram depicting illustrative memory bank circuitry, consistent with one or more aspects of the innovations herein. Referring to FIG. 7, an exemplary detail diagram of each bank 600 of the illustrative memory of FIG. 6a is shown. Here, for example, 2 bits of write buffer may be contained in the circuitry/chip via write coherency register circuitry 703. In the illustrative implementation shown, data bus wri and wfi are inputted into circuitry 703 and 2 cycles of data are buffered and stored. The output of this circuitry 703 is sent to the memory array and I/O sense amplifier circuitry, Wdry 702 through the common I/O bus gr and gf. Two cycles of write buffer data are also outputted to read circuitry 704 as 1st cycle's DDR data Ar, Af and 2nd cycle's DDR data Br and Bf. Address A may be input to address and match circuitry 701, which sends out read or write address RKKx to the memory array 702. Address and match circuitry 701 may store 2 write cycle addresses corresponding to the data stored in Write coherency register 703. Address and match circuitry 701 also generates write buffer match signals fmat<0> and fmat<1> to read circuitry 704. When an incoming read address matches one or both stored write addresses, fmat <0> or fmat <1> is high and read circuitry 704 takes one of the Ar, Af or Br, Bf and outputs as iri and ifi, while the memory output data gr and gf are ignored. Further, memory array 702 receives address RKKx. On the read cycle, memory data from memory array 702 is outputted to gr and gf and then to read circuitry 704. On the write cycle, gr and gf becomes data input bus generated from write coherency register 703 and are written into memory array 702 with the corresponding write address RKKx.

D and D_DBI# are written into memory in the DBI format and read out from the memory to the output also as the original DBI format. D and D_DBI# are also stored in the Write coherency register 703 in the DBI format and read circuitry 704 processes gr, gf bus and Ar, Af, Br and Bf bus in the DBI format. No DBI conversion occurs in the Data input path and no DBI formatting occurs in the data output path.

In operation, wri and wfi are heavily loaded global data bus(es), and they are also DBI formatted. The bus loading and the driver are structured, e.g. as circuitry 555, maximum only half of the bus can toggle and the bus driver is complementary driver. Therefore, compared to the conventional scheme without DBI, this circuit has much reduced AC noise, AC power and improved speed.

Additionally, iri and ifi are heavily loaded single ended I/O read data line and are pre-charged high during sensing, they are also DBI formatted. At maximum, only half of the bus may switch from the pre-charged high state to the low state after sensing, compared to all of the bus can switch to low to the conventional scheme without DBI. Therefore, this circuit has much reduced AC noise, AC power and improved speed.

Also, gr and gf may be heavily loaded bidirectional IO lines. Same as wri/wfi and iri/ifi, they are also DBI formatted. In the read cycle, gr and gf are pre-charged high during sensing. At maximum, only half of the bus may switch from the pre-charged high state to the low state after sensing. In the write cycle, gr and gf are also pre-charged high before they are sent to the memory array 702. At maximum, only half of the bus may switch from the pre-charged high state to the low state when they are sent to the memory array 702. In sum, a maximum of only half of gr and gf can switch from pre-charged high to final low state either reading from, or writing to, the memory array, compared to conventional schemes without DBI when all of the bus can switch to low. Therefore, systems and methods involving such circuitry/features may have significant reduced AC noise, AC power and improved speed.

Because the data in all of circuit in FIG. 6a are DBI formatted, there is no DBI converter logic delay in the data input path and there is no DBI formatter logic delay in the data output path. Also in FIG. 7, data flows from data input to write buffers in Write coherency register 703 to Read unit 704 to iri and ifi read data bus, and then data output are also always the same DBI format. As such, there is no delay due to DBI converter logic and DBI formatter logic as conventional designs incur. Therefore, systems and methods involving such circuitry/features may have significant improved speed.

Figure 8A:
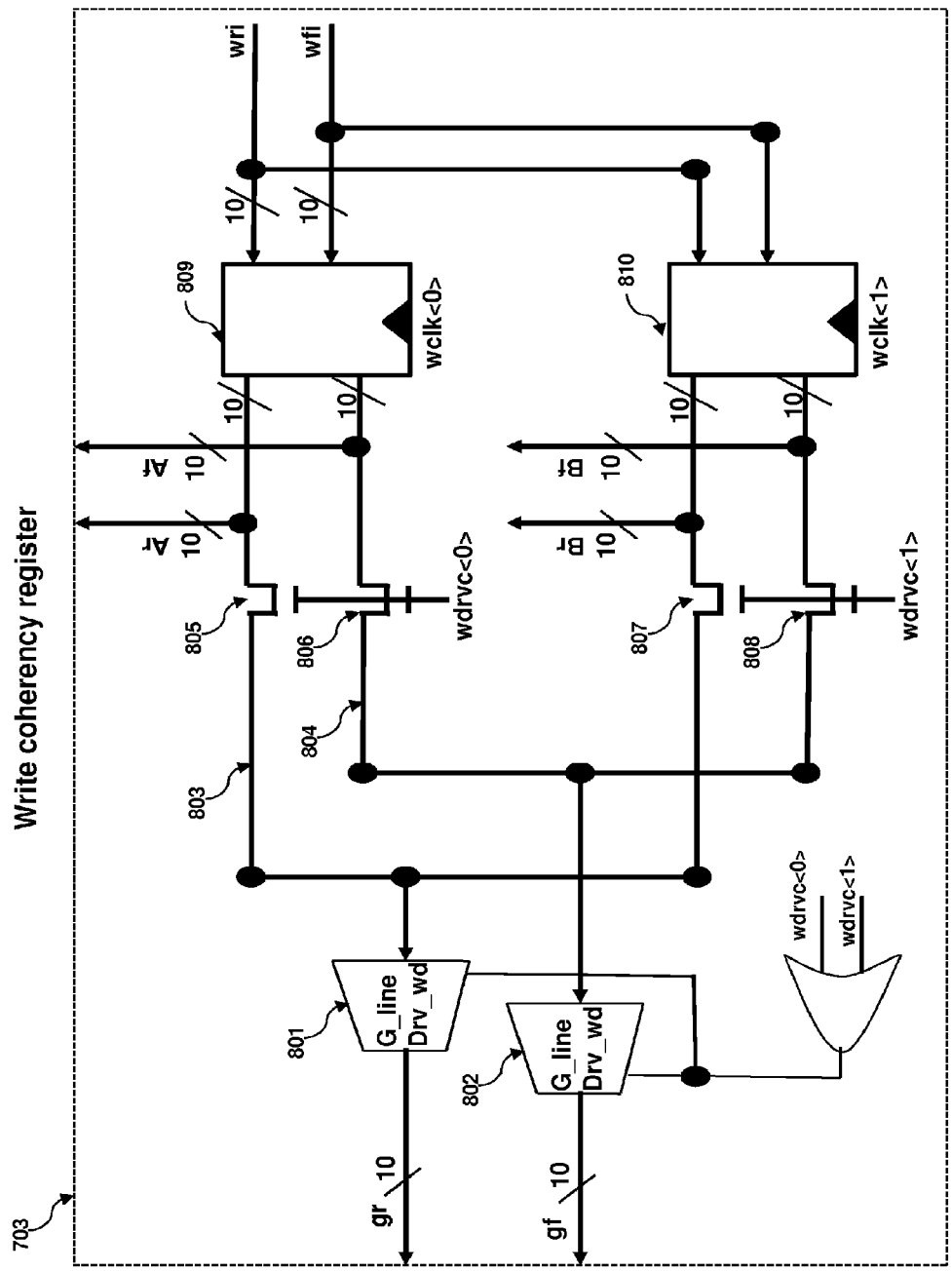
FIG. 8*a* is a block diagram showing an illustrative logic diagram of exemplary write coherency register circuitry 703 consistent with aspects related to the innovations herein.

FIG. 8a is a block diagram showing an illustrative logic diagram of exemplary write coherency register circuitry 703 consistent with aspects related to the innovations herein.

FIG. 8b is a timing diagram showing illustrative timing operation consistent with the implementation of FIG. 8a. Referring to FIG. 8a, wri and wfi are inputs to the Write coherency register circuitry 703. As set forth in FIG. 8b, command CMD and Address Ain may be input every 8 cycles for tRC=8 and Data D is inputted on $13^{th}$ cycle for WL=13. In an illustrative write operation of a memory bank, for example, WR0 and AW0 may be input at cycle 0 as the first write operation and WR1 and AW1 are input at cycle 8 for the next write operation. The DDR data D DR0 and DF0 corresponding to WR0 and AW0 are input at the rising and falling edges of $13^{th}$ clock. The DDR data D DR1 and DF1 corresponding to WR1 and AW1 are input at the rising and falling edges of $21^{th}$ clock. As will be explained further in connection with FIGS. 12A and 12B and it is also shown in FIG. 8b, DR0 and DF0 will be passed from D input bus to wri and wfi at the next cycle, cycle 14. Likewise, DR1 and DF1 are on wri and wfi at cycle 22. As in FIG. 8b, a pulse is generated at wclk<0> by write cycle command WR0 inputted to the chip at clock cycle 0 and a pulse is generated at wclk<1> from write cycle command WR1 at clock cycle 8. It is not show in the FIG. 8b, but WR2 will later generate a pulse at wclk<0> and WR3 will generate a pulse at wclk<1>. The sequence of wclk<0> and wclk<1> is set during the chip power up, the pulses at wclk <0> and wclk<1> are always generated alternately upon receiving the external write command. The information on wri and wfi are stored in registers 809 and 810 by wclk<0> and wclk<1>. The outputs of 809 are first write cycle DDR data Ar and Af and the outputs of 810 are next write cycle DDR data Br and Bf. These outputs are shown in the FIG. 8b as DR0/DF0 on Ar/Af and DR1/DF1 on Br/Bf. Similar to wclk<0> and wclk<1>, wdrvc<0> and wdrvc<1> are generated from external write command and are generated alternately. As show in FIG. 8b, wdrvc <0> is generated earlier than wclk<0> in response to the write command. For example, corresponding to WR0 at cycle 0, wdrvc<0> pulse is generated from cycle 2 to cycle 7, while wclk<0> is generated on cycle 15. Likewise, wdrvc<1> is also generated the same way. The data on Ar and Af then pass through the pass gate 805 and 806 controlled by wdrvc<0> to nodes 803 and 804 and then pass through G_line Drv_wd 801 and 802 controlled by the "OR" gate output of wdrvc<0> and wdrvc<1> to gr and gf 2 write commands later. This timing is shown on FIG. 8b that DR0/DF0 on Ar/Af pass to gr/gf when wdrvc<0> high pulse is generated by WR2. Likewise, the data on Br and Bf pass through the pass gate 807 and 808 to node 803 and 804 and then pass through G_line Drv_wd 801 and 802 controlled by the "OR" gate output of wdrvc<0> and wdrvc<1> to gr and gf 2 write commands later.

FIG. 9a is a block diagram showing an illustrative logic diagram of exemplary memory array and I/O sense amplifier circuitry 702 consistent with aspects related to the innovations herein. Referring to FIG. 9 A, read or write address RKKx is received by the memory array 901. During read cycle, bi-directional buses aio/br and aio/bf are output from memory array 901 to IO S/A 902 and IO S/A 904, respectively. The IO S/A 902, 904 also receive iosaen as an enabling signal and send outputs to bi-directional buses gr 906, gf 907, respectively. During the write cycle, Wdry 903, 905 receive inputs from bi-directional buses gr and gf, respectively. The Wdry 903, 905 also receive wdren as an enabling signal and send outputs to bi-directional buses aio/br and aio/bf, respectively. Aio/br and aio/bf then send to Memory Array 901 at location corresponding to the address RKKx.

Like gr and gf, aio/br and aio/bf are bi-directional buses, pre-charged high and are DBI formatted, and a maximum of only half of the buses can switch from pre-charged high to final low state either reading from, or writing to, the memory array, compared to conventional schemes without DBI when all of the bus can switch to low. Therefore, systems and methods involving such circuitry/features may have significantly reduced AC noise, AC power and improved speed.

FIG. 9b is a timing diagram showing the timing operation of exemplary memory array and I/O sense amplifier circuitry 702 in FIG. 9a. As example of write operation, gr/gf data is updated to DR1/DF1(−2) at cycle 2, the write data inputted from 2 write commands earlier, in response to write command WR1 at cycle 0. RKKx is also updated to AW1(−2) at cycle 2, the write address inputted from 2 write commands earlier. Wdren is then active from cycle 4 to pass DR1/DF1 (−2) data in gr and gf buses to aio/br and aio/bf buses; these data are then send to Memory Array 901 at location corresponding to the address RKKx. As example of read operation, read command RD0 and read address AR0 are presented at cycle 16 on CMD and Ain buses, in response, AR0 is generated on cycle 18 on RKKx bus. The memory array read data aio/br and aio/bf are then available no later than cycle 23 in response to RKKx address AR0. Iosaen is then activating IO/SA at cycle 23, in time to transfer read data from aio/br and aio/bf to gr and gf.

FIG. 10 is a block diagram showing an illustrative logic diagram of exemplary read circuitry 704 consistent with aspects related to the innovations herein. Referring to FIG. 10, Mux 1007, 1008 receive inputs from IO S/A outputs gr, gf, respectively, and from Write coherency register outputs Ar, Br, or Af, Bf, respectively. As described further in connection with FIG. 11a, fmat<0> is 1 when at the read operation, the inputted read address matches with the stored write address inputted 2 write commands earlier. Likewise, fmat<1> is 1 when the inputted read address matches with the stored write address inputted 1 write command earlier. If both stored write addresses are the same and read address is matched, then the match logic is done such that only fmat<1> is 1 and fmat<0> is kept to 0, because fmat<1> represents the latest data. When either fmat<0> or fmat<1> is 1, meaning the read address is matching the stored write address, the Mux 1007, 1008 pass data from buses Ar, Af, if fmat<0> is 1, or from Br, Bf, if fmat<1> is 1, to Mux outputs 1010 and 1011, respectively. If fmat<0> and fmat<1> are both 0, meaning the read address is not matching the stored write addresses, then the Mux 1007, 1008 pass input data from gr and gf to the Mux outputs 1010 and 1011, respectively. "OR" gate 1009 generates the Mux control signal with the input fmat<0> and fmat<1>. Latches or Registers 1012, 1013 store Mux outputs 1010, 1011 by fgclkr and fgclkf and output iri and ifi, respectively. Latches or Register 1012's and 1013's outputs iri and ifi are the outputs of memory bank 600, so the registers/latches are done such that the outputs can be wired "OR" together between eight banks. The data path from gr, gf to iri and ifi respectively are 10 bits DBI formatted bus including 9 Data bits and 1 D_DBI# bit. In this manner, the stored write data outside of memory array at write coherency register 703 are also passed through Read unit 704 to data output buffer 603 as 10 bits DBI formatted bus. No DBI Converter and DBI Formatter needed in this data path just described.

Figure 11A:
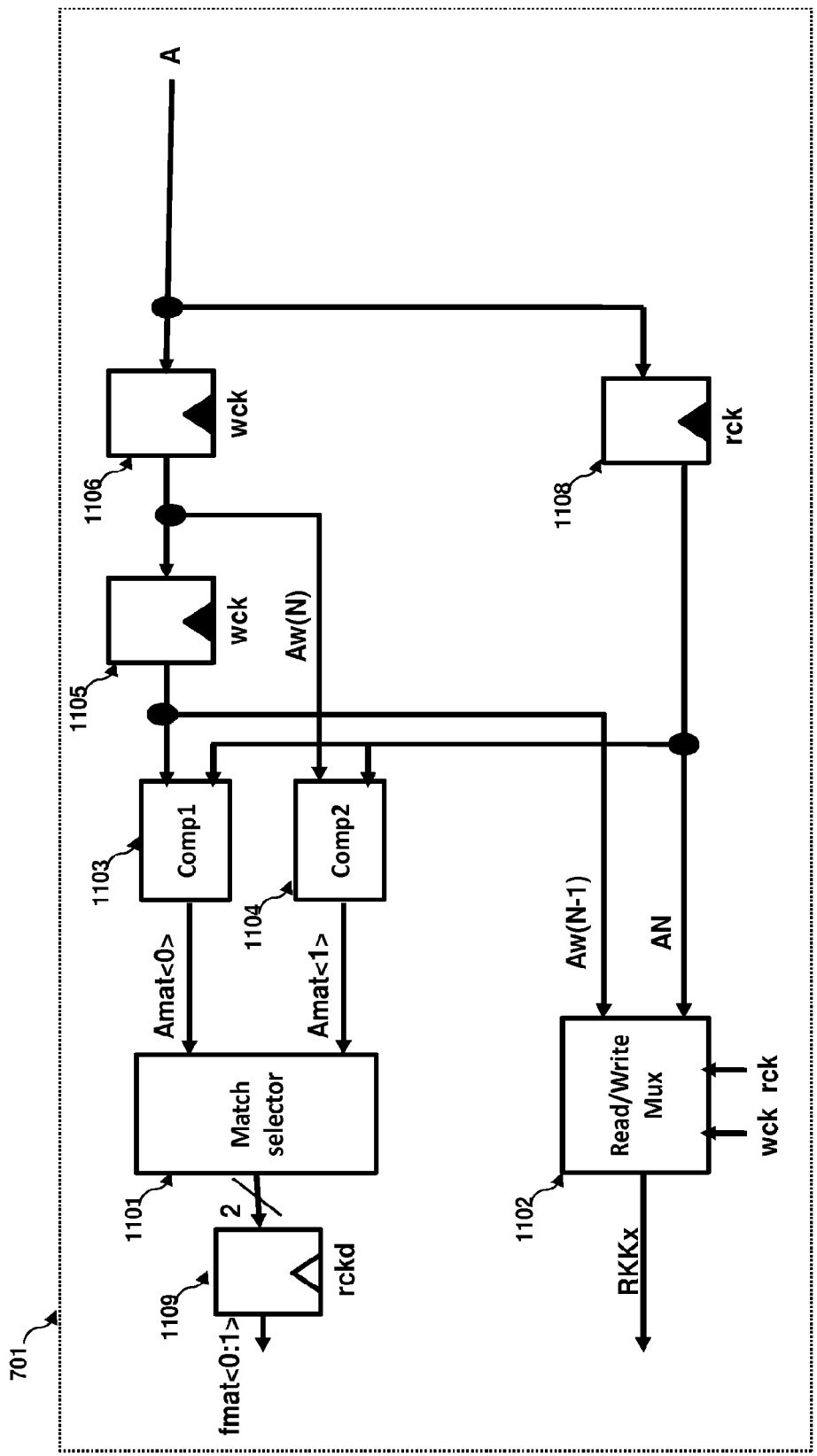
FIG. 11*a* is a block diagram showing an illustrative logic diagram of exemplary addressing and matching circuitry 701 consistent with aspects related to the innovations herein.

FIG. 11a is a block diagram showing an illustrative logic diagram of exemplary addressing and matching circuitry 701 consistent with aspects related to the innovations herein. FIG. 11b is a timing diagram depicting illustrative timing operation consistent with the circuitry of FIG. 11a. Referring to FIG. 11a and FIG. 11b, during write operation, register/latch 1106 stores Address input by wck and output as Aw(N). As an illustrative write operation, for example, write command WR0 may be presented at CMD bus and write address AW0 is at address Ain bus at cycle 0. In response to WR0, wck is generated storing AW0 into Aw(N) at register/latch 1106. On the next write command WR1 and write address AW1 are presented at cycle 8, AW0 is then stored into Aw(N−1) at register/latch 1105 and AW1 is stored into Aw(N) at 1106. During read operation, register/latch 1108 stores Address input by rck and output as AN. Referred to FIG. 11b, as example of read operation, read command RD0 is presented at CMD bus and read address AR0 is at address Ain bus at cycle 24. In response to RD0, rck is generated storing AR0 into AN at register/latch 1108. AN is then compared to Aw(N−1) at comparator Comp1 1103 and Aw(N) at comparator Comp2 1104. The output of comparators Comp1 1103 and Comp2 1104, Amat<0> or Amat<1>, respectively, is 1 if AN is same as Aw<N−1> or Aw<N>, respectively. Amat<0> or Amat<1> is 0 if AN is not the same as Aw<N−1> or Aw<N>, respectively. Match selector 1101 passes the states of Amat<0> or Amat<1> to the input of register or latch 1109. Register/latch 1109 is clocked by rckd, a delayed clock from rck. Register/latch 1109 is then produced the output fmat <0> and fmat<1>. The states of fmat<0> or fmat<1> are same as Amat<0> or Amat<1>, respectively, except when both Amat<0> and Amat<1> are 1. If both Amat<0> and Amat<1> are 1, then fmat<1> is 1 and fmat<0> is 0 because fmat<1> represent the latest data. The states and the timing of fmat is also depicting in FIG. 11b.

FIG. 12A is a block diagram showing an illustrative logic diagram of exemplary data input buffer circuitry 604 consistent with aspects related to the innovations herein. Referring to FIG. 12A, the data input buffer receives the D_DBI# to the buffer 1211 and D<8:0> to buffer 1210 and their outputs 1208 are provided to registers/latches 1205 and 1206. D and D_DBI# are DDR format data bus, meaning the data is inputted at both edges of clock. Register/latch 1205 stores 10 bits of D and D_DBI# by the rising edge of dk, which is the same phase as the main clock clk. Latch 1201 then pass the output of 1205, 1203 at the falling edge of dk to wri. Register/latch 1206 stores second DDR data of 10 bits of D and D_DBI# by the falling edge of dk. Wfi is the output of 1206 and is available at the falling edge of dk, same time as wri. FIG. 12B is an illustrative timing diagram depicting exemplary timing operation consistent with FIG. 12A. The falling edge of dk may also be a rising edge of a complementary clock to dk.

FIG. 13 is a block diagram showing an illustrative logic diagram of exemplary data output buffer circuitry 603 consistent with aspects related to the innovations herein. Referring to FIG. 13, iri and ifi are outputs from memory banks and as inputs to the data output buffer 603. Iri and ifi are multiplexed by qclkr and qclkf and latched and then outputted to a DDR formatted Q and Q_DBI#. Qclkr and qclkl are generated by a PLL (Phase Locked Look) or a DLL (Delayed Locked Loop) circuit such that Q and Q_DBI# DDR data are aligned to the both edges of the clock clk. Q and Q_DBI are DBI formatted data, namely, no more than half of the data bits are 0.

FIG. 14 is a timing diagram illustrating exemplary read from array, write to array and coherency register functionality consistent with aspects related to the innovations herein. Referring to FIG. 14, read command RD0 on CMD bus and read address AR0 on Ain bus are presented at cycle 16. The write command WR1 and write address AW1 are presented at cycle 0 and the data associated with AW1, DR1/DF1, are entered at cycle 13. DR1 and DF1 are stored at Ar/Af of Write coherency register 703 when read command RD0 is executed. Likewise, the write command WR2 and write address AW2 are presented at cycle 8 and the data associated with AW2, DR2/DF2, are entered at cycle 21. DR2 and DF2 are stored at Br/Bf of Write coherency register 703 when read command RD0 is executed. FIG. 14 shows the read operation when AR0 is not the same as either AW1 or AW2, Output Q is reading from the memory array data.

FIG. 15 is a timing diagram illustrating exemplary read from array and coherency register functionality consistent with aspects related to the innovations herein. Like FIG. 14, FIG. 15 has the same timing of CMD, Ain and D. However, FIG. 15 shows the read operation when AR0 is same as AW1 but different from AW2, Output Q is reading from Ar/Af of Write coherency register 703.

FIG. 16 is a timing diagram illustrating exemplary read from array and coherency register functionality consistent with aspects related to the innovations herein. Like FIG. 14, FIG. 16 has the same timing of CMD, Ain and D. However, FIG. 16 shows the read operation when AR0 is same as both AW1 and AW2, Output Q is reading from Br/Bf of Write coherency register 703.

In summary, FIGS. 14-16 illustrate exemplary read from either the memory array, or from one of the coherency registers. FIGS. 14-16 also illustrate how the data may be stored to the write coherency registers, and also how the data transferred from the write coherency register to the memory array. In some implementations, during the entire write operations, the data is input from the external pin with DBI format, stored into the write coherency registers with the same DBI format, and transferred from the write coherency register to the memory also in the same DBI format. For read operation, according to one aspect, the DBI formatted data is read from the memory array to the IO sense amp, and then the same DBI formatted data flows to the output pin. Or, according to another aspect, when the data is read from the write coherency registers, the same DBI formatted data flows to the output pins. Compared to the non-DBI formatted internal bus design(s), the innovations set forth herein improve read and write performance by skipping DBI formatter logic and DBI converter logic. Further, the inventions described herein may also reduce AC noises and/or reduce AC power and, in turn, improve performance and/or speed.

In addition to the above memory innovations and memory architecture, the present inventions also include, inter alia, methods of memory operation, methods of fabricating memory devices consistent with the features and/or functionality herein, products (such as DRAMs or products embodying DRAMs), and products produced via such processes. By way of example and not limitation, methods of memory fabrication herein may include known RAM manufacturing processes such as in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001,674, 6,117,754, 6,127,706, 6,417,549, 6,894,356, and 7,910,427 as well as U.S. patent application publication No. US2007/0287239 A1, which are incorporated herein by reference. In some instances, aspects of the innovations herein may be achieved involving logic and/or logic instructions including program modules, executed in association with and/or to control the circuitry, for example. In general, program modules may include routines, programs, objects, components, data structures, etc. that performs particular tasks or implement particular logic, control, delay or instructions. The inventions may also be practiced in the context of distributed circuit settings where circuitry is connected via communication buses, circuitry or links. In distributed settings, control/instructions may occur from both local and remote computing elements including memory storage devices. As disclosed herein, features consistent with the present inventions may be utilized via and/or involved with computer hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of them. Further, while some of the disclosed implementations describe specific hardware components, certain systems and methods consistent with the innovations herein may be implemented in the context of other hardware and/or combination(s) of hardware, software and/or firmware. Moreover, the above-noted features and other aspects and principles of the innovations herein may be implemented in various memory environments. Such environments and related applications may be specially constructed for performing the various routines, processes and/or operations according to the invention or they may include a general-purpose computer or computing platform selectively activated or reconfigured by code to provide the necessary functionality.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that some control, logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves. Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A DRAM device involving data signals grouped into 10 bits, the device comprising:
   a memory core;
   input circuitry that receives a data bus inversion (DBI) bit associated with a data signal as input directly, without transmission through DBI logic associated with an input buffer;
   circuitry, including one or both of section circuitry and memory circuitry, that stores the DBI bit into the memory core, reads the DBI bit from the memory core, and provides the DBI bit as output, wherein the memory device stores and processes the DBI bit on an internal data bus as a regular data bit; and
   a data buffering circuit coupled to the memory core, the data buffering circuit including a write buffer comprising a data register positioned between the input circuitry and the DBI logic and storing the data to be written into the memory core on a later cycle, an address register storing addresses corresponding to the stored data signal, and a comparator comparing a read address to the addresses stored in the write buffer,
   wherein data from the data register is retrieved as an output data signal instead of data from the DBI logic when the comparator determines that the address stored in the address register matches the read address, thereby causing the output data signal to bypass the DBI logic.

2. The device of claim 1, wherein the input circuitry comprises: a bus driver characterized by a first capacitance load, a second capacitance load and a decoupling capacitor coupled between the first capacitance load and the second capacitance load.

3. The device of claim 1, wherein the input circuitry comprises: a bus driver characterized by a first capacitance load and a second capacitance load, wherein one of the capacitance loads is high-go-low while the other capacitance load is low-go-high.

4. The device of claim 1, wherein the input circuitry comprises: a bus driver including a first capacitance load supplying a second capacitance load with charge via a decoupling capacitor.

5. The device of claim 1, wherein the input circuitry comprises: a bus driver including a discharge of a first capacitance load supplies charge to a second capacitance load through a decoupling capacitor to reduce power consumption and/or switching noise.

6. The device of claim 1, wherein the input circuitry comprises: coupling circuitry connected between a power supply bus and a ground bus, wherein the coupling circuitry provides an electrical path between a first capacitance load and a second capacitance load such that charge is supplied to the coupling circuitry from the power supply bus and the first capacitance load to a decoupling capacitor for data bit switching of the first capacitance load, and then the coupling circuitry supplies the charge from the decoupling capacitor to the second capacitance load for data bit switching of the second capacitance load.

7. The device of claim 1, wherein the input circuitry comprises: coupling circuitry configured to switch data bits in a first capacitance load and provide a charge from the first capacitance or load to a decoupling capacitor, and switch data bits in a second capacitance load and provide the charge of the decoupling capacitor to the second capacitance load.

8. The device of claim 1, wherein the input buffer comprises a double data rate address bus that inputs a first half of an address in a first half of a clock cycle, inputs a second half of the address in a second half of the clock cycle, and outputs the entire address at the falling edge of the clock.

9. A DRAM memory device involving data signals grouped into 10 bits, the device comprising:
a memory core;
circuitry including transistors and registers/latches arranged and connected to:
receive a data bus inversion (DBI) bit, associated with a data signal grouped into 10 bits, as input directly, without transmission through DBI logic associated with an input buffer;
store the DBI bit into the memory core;
read the DBI bit from the memory core; and provide the DBI bit as output, wherein the memory device stores and processes the DBI bit on an internal data bus as a regular data bit; and
a data buffering circuit coupled to the memory core, the data buffering circuit including a write buffer comprising a data register positioned between the input circuitry and the DBI logic and storing the data to be written into the memory core on a later cycle, an address register storing addresses corresponding to the stored data signal, and a comparator comparing a read address to the addresses stored in the write buffer,
wherein data from the data register is retrieved as an output data signal instead of data from the DBI logic when the comparator determines that the address stored in the address register matches the read address, thereby causing the output data signal to bypass the DBI logic.

10. The device of claim 9, wherein the input buffer comprises a double data rate address bus that inputs a first half of an address in a first half of a clock cycle, inputs a second half of the address in a second half of the clock cycle, and outputs the entire address at the falling edge of the clock.

11. The device of claim 9, further comprising an output buffer that buffers outputs from memory by multiplexing the outputs with signals from a phase locked loop or delayed locked loop such that the outputs are aligned to both edges of a clock signal.

12. A DRAM memory system involving data signals grouped into 10 bits, comprising:
one or more sense lines connecting sense circuitry to output circuitry, wherein at least one sense line is data bus inversion (DBI) formatted and includes a DBI bit;
circuitry including transistors, registers, latches and/or components arranged and connected to:
receive the DBI bit associated with a data signal as input directly, without transmission through DBI logic associated with an input buffer;
store the DBI bit into a memory core, read the DBI bit from the memory core, and provide the DBI bit as output, wherein the at least one sense line is precharged high such that half or more of the lines will be transitioned to a final state of high; and
a data buffering circuit coupled to the memory core, the data buffering circuit including a write buffer comprising a data register positioned between the input circuitry and the DBI logic and storing the data to be written into the memory core on a later cycle, an address register storing addresses corresponding to the stored data signal, and a comparator comparing a read address to the addresses stored in the write buffer,
wherein data from the data register is retrieved as an output data signal instead of data from the DBI logic when the comparator determines that the address stored in the address register matches the read address, thereby causing the output data signal to bypass the DBI logic.

13. The system of claim 12 further comprising:
address buffer circuitry including an address input, a clock, and a plurality of registers and/or latches arranged in a circuit configuration:
wherein addresses are stored in the registers and/or latches such that all bits of the address bus are ready to send to memory banks at the falling edge of the clock.

14. The system of claim 13, wherein:
the address buffer circuitry further includes a complementary clock; and
the address input is a double data rate address bus, with half of the address being received at the rising edge of the clock and the other half of the address is received at the falling edge of the clock, or at the rising edge of the complementary clock.

15. The system of claim 12, wherein the DRAM has multiple banks such that random access cycle time of the DRAM chip is 1/N of random access cycle time of each bank, with N being quantity of the banks.

16. The system of claim 15, further comprising:
write coherency registers storing write data and write addresses from the previous write commands in each bank;
address comparators comparing read address and the write address stored in write coherency registers in each bank;
wherein a multiplex in the read path of each bank passes-through the read data either from the memory array, or from the write coherency registers, to the output of the bank.

17. The system of claim 16, wherein, upon matching one of the address comparators, the read data is taken from the data stored in the write coherency registers to the read bus outputting from the selected bank.

18. The system of claim 17, wherein the output data of the selected bank is sent through the output buffer to the device output.

19. The system of claim 15, wherein data format of the data from the data input, through the storage in the memory array and write coherency register, to the data output, is DBI format.

20. The system of claim 12, wherein:
1 bit is a DBI# bit; and
9 bits are DBI formatted data bits.

21. A method of DRAM memory operation involving data signals grouped into 10 bits, the method comprising:
receiving a data bus inversion (DBI) bit and data bits as input;
outputting the DBI bit and the data bits to section circuitry;
storing the data bits in a data register;
comparing an address stored in an address register with a read address;
when the address stored in the address register does not match the read address:
writing the data bits into bit lines of a memory array;
reading the data bits from the memory array; and
outputting the DBI formatted data bits and the DBI bits, wherein a data format of the data from the data input, throughout storage in the memory array and one or more write coherency registers, to the data output, is DBI format; and
when the address stored in the address register matches the read address:
writing the data bits from the data register into bit lines of a memory array, thereby bypassing the DBI converter logic.

22. The method of claim 21, further comprising:
operating a bi-directional bus pre-charged high, in connection with the memory array, the write coherency register(s) and a multiplexer, the multiplexer multiplexing the data from the memory array or the write coherency register(s), such that half or more of the bus stay high at the final state;
wherein the bi-directional bus serves as a sensing bus during read cycle; and wherein the bi-directional bus is utilized as a data line writing to the memory array during write cycle.

23. The method of claim 22, wherein the DRAM has multiple banks such that random access cycle time of the DRAM chip is 1/N of random access cycle time of each bank, with N being quantity of the banks.

24. The method of claim 23, further comprising:
operating write coherency registers storing write data and write addresses from the previous write commands in each bank; and
operating address comparators comparing read address and the write address stored in write coherency registers in each bank;
wherein a multiplexer in the read path of each bank passes-through the read data either from the memory array, or from the write coherency registers, to the output of the bank.

25. The method of claim 24, wherein upon matching one of the address comparators, the read data is taken from the data stored in the write coherency registers to the read bus outputting from the selected bank.

26. The method of claim 25, wherein the output data of the selected bank is sent through the output buffer to the device output.

27. The method of claim 21, further comprising:
operating a Din bus via a bus driver, characterized by a first capacitance load and a second capacitance load, such that maximum bus switching happens when approximately half of the capacitance loads is high-go-low while the other half of capacitance load is low-go-high.

28. The method of claim 21, further comprising:
operating a Din bus via a bus driver that discharges a first capacitance load and supplies charge to a second capacitance load through a decoupling capacitor.

29. The method of claim 21, further comprising:
operating coupling circuitry connected between a power supply bus and a ground bus, the coupling circuitry providing an electrical path between a first capacitance load and a second capacitance load such that charge is supplied to the coupling circuitry from the power supply bus and the first capacitance load to a decoupling capacitor for data bit switching of the first capacitance load, and then the coupling circuitry supplies the charge from the decoupling capacitor to the second capacitance load for data bit switching of the second capacitance load.

* * * * *